(12) United States Patent
Asada

(10) Patent No.: US 6,404,313 B2
(45) Date of Patent: Jun. 11, 2002

(54) ELECTROMAGNETIC ACTUATOR

(75) Inventor: Norihiro Asada, Shouwa-machi (JP)

(73) Assignee: Nihon Shingo Kabushiki Kaisha, Saitama-ken (JP)

( * ) Notice: Subject to any disclaimer, the term of this patent is extended or adjusted under 35 U.S.C. 154(b) by 0 days.

(21) Appl. No.: 09/758,528

(22) Filed: Jan. 11, 2001

Related U.S. Application Data

(62) Division of application No. 08/793,386, filed on Apr. 25, 1997, now Pat. No. 6,232,861.

(30) Foreign Application Priority Data

| Jun. 5, 1995 | (JP) | ............................................. 7-138081 |
| Jun. 5, 1995 | (JP) | ............................................. 7-138082 |
| Jun. 15, 1995 | (JP) | ............................................. 7-148811 |
| Jun. 5, 1996 | (JP) | ................................. PCT/JP96/01520 |

(51) Int. Cl.$^7$ .......................... G02B 7/18; G01R 13/38; H01F 7/08

(52) U.S. Cl. ....................... 335/222; 335/223; 335/226; 335/224; 335/229; 310/36; 359/196; 359/198; 359/199; 359/212; 359/214; 359/223; 359/224; 359/225

(58) Field of Search ................................. 335/220–226, 335/229, 231; 310/36; 73/668; 359/196, 197, 198–203, 212–226, 903

(56) References Cited

U.S. PATENT DOCUMENTS

| 4,421,381 A | * 12/1983 | Ueda et al. ................... 350/6.6 |
| 5,378,653 A | 1/1995 | Yanagida ..................... 437/194 |

FOREIGN PATENT DOCUMENTS

| DE | 3915650 A1 | 11/1990 |
| EP | 0427327 A1 | 5/1991 |
| EP | 0686863 A1 | 12/1995 |
| EP | 0692729 A1 | 1/1996 |
| JP | 60-107017 A | 6/1985 |
| JP | 3-58613 | 6/1991 |
| JP | 4-211217 | 8/1992 |
| JP | 7-27989 | 1/1995 |
| JP | 07027989 A | 1/1995 |
| JP | 8-166289 | 6/1996 |

* cited by examiner

Primary Examiner—Ramon M. Barrera
(74) Attorney, Agent, or Firm—Carella Byrne Bain Gilfillan Cecchi; Elliot M. Olstein; William Squire

(57) ABSTRACT

An electromagnetic actuator includes an external movable plate formed integrally with a semiconductor substrate. A first torsion bar movably supports the movable plate with respect to the semiconductor substrate. An internal movable plate is disposed inside the external movable plate. A second torsion bar rotatably supports the internal movable plate relative to the external movable plate, and is positioned at a right angle relative to the first torsion bar; and further includes a single turn first driving coil extending around the external movable plate; a single turn second driving coil extending around the internal movable plate, and which is connected in series with the first driving coil; magnetic field generating means for applying a magnetic field to the first and second driving coils; and an optical element having an optical axis and located on the internal movable plate. A current is caused to flow through the first and second driving coils to produce a force corresponding to each coil and to each plate, the external and internal movable plates displacing in response to the corresponding coil forces applied thereto and thus vary the direction of displacement of said optical axis. In one embodiment, the single turn first and second driving coils are closed-looped. A method of manufacturing the electromagnetic actuator includes forming an aluminum layer on the semiconductor substrate by aluminum deposition; and forming the driving coils from the aluminum layer through photolithography and aluminum etching. Other embodiments are disclosed.

15 Claims, 34 Drawing Sheets

FIG.4
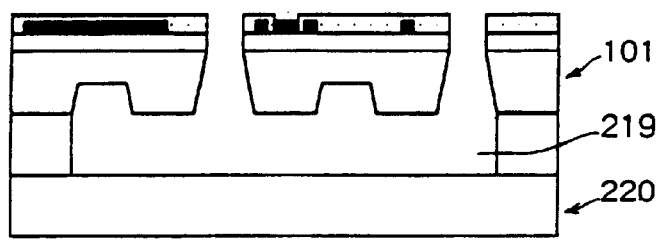
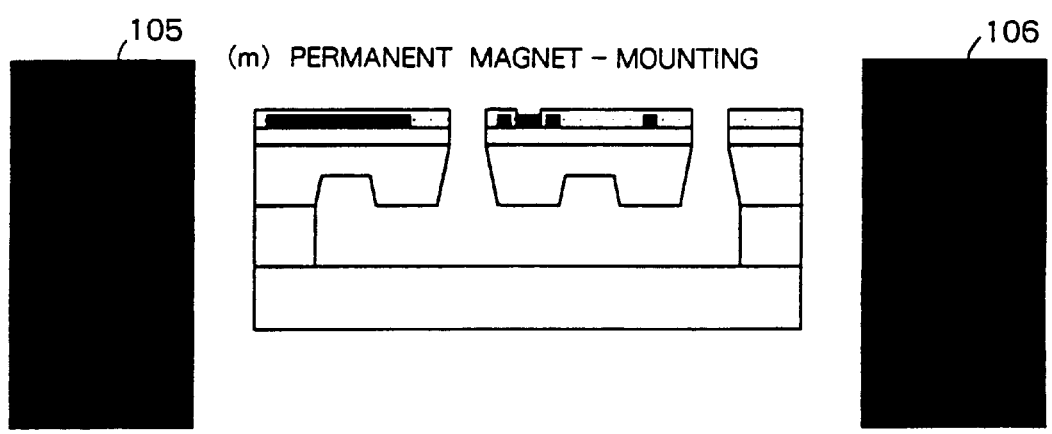

FIG.15
(h) OXIDE LAYER ETCHING
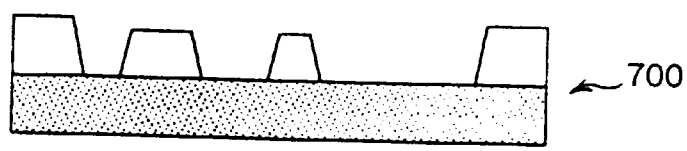
(i) ASSEMBLY · BONDING
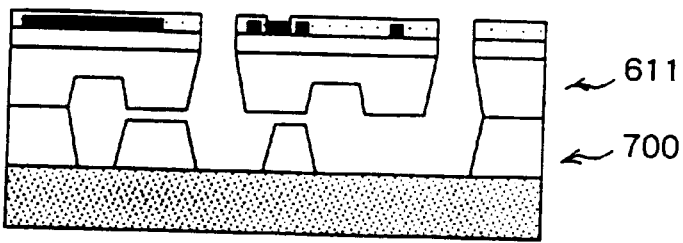
(j) PERMANENT MAGNET - MOUNTING
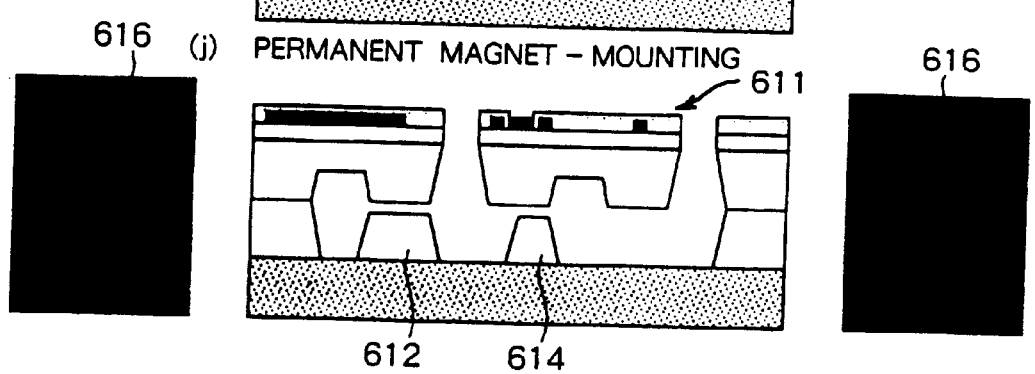

(h) Al DEPOSITION (i) PHOTOLITHO + Al ETCHING (j) PHOTOSENS.ORGANO.PROTECT.LAYER (k) OXIDE LAYER ETCHING (l) ASSEMBLY · BONDING

FIG.22
(l) OXIDATION
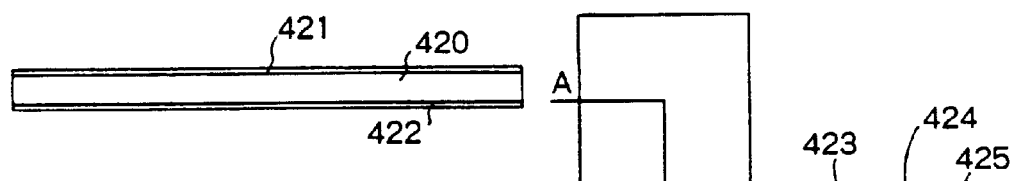
(m) PHOTOLITHO + OXIDE LAYER ETCHING
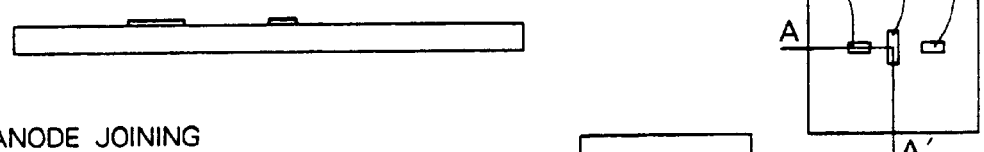
(n) ANODE JOINING
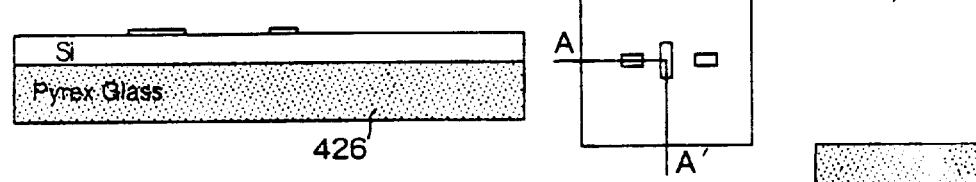
(o) Si ANISOTROPIC ETCHING
(p) ANODE JOINING
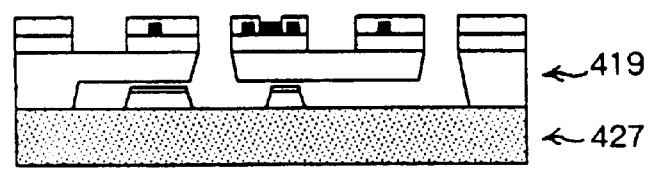

*FIG.27*
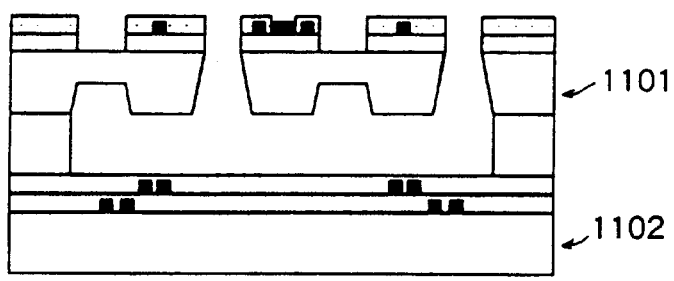
(a) ASSEMBLY
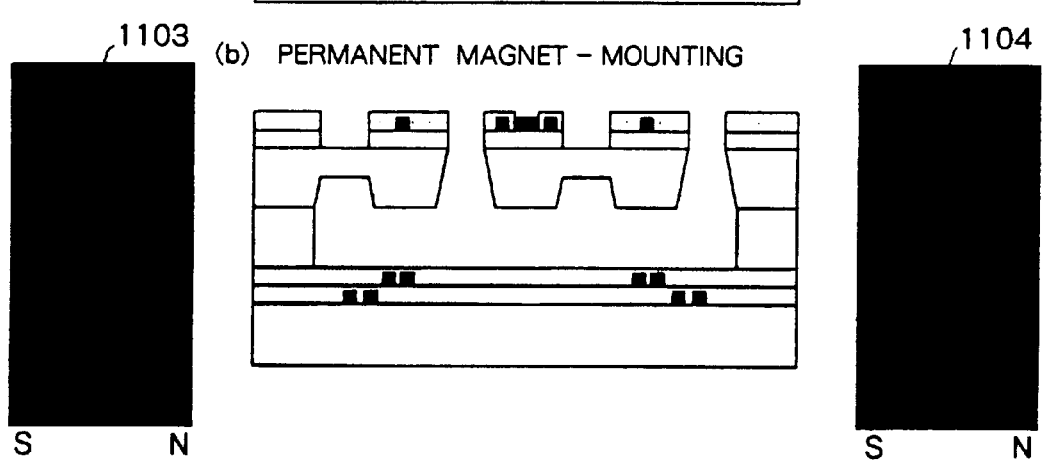
(b) PERMANENT MAGNET – MOUNTING

ELECTROMAGNETIC ACTUATOR

This application is a division of application Ser. No. 08/793,386 filed Apr. 25, 1997, now U.S. Pat. No. 6,232,861.

BACKGROUND OF THE INVENTION

1. Field of the Invention

The present invention relates to an electromagnetic actuator based on the operation principle of galvanometer operated mirror utilizing the process for manufacturing semiconductor devices, such as transistors or integrated circuits.

2. Brief Description of the Related Art

Examples of electromagnetic actuators of such a type are disclosed in Japanese laid-open publication Nos. 5-320524, 6-9824 6-310657 and 6-327569.

Disclosed in Japanese laid-open publication Nos. 5-320524 is a fundamental model of an electromagnetic actuator of this type, comprising a semiconductor substrate, on which a movable plate and a torsion bar are integrally mounted, wherein the torsion bar swingably supports the movable plate with respect to the substrate, a driving coil is formed around the movable plate, a galvanometer operated mirror mounted to the movable plate, and means for generating a magnetic field for applying a magnetic field for the driving coil; and the movable plate is driven by the galvanometer operated mirror by flowing a current through the driving coil.

Laid-open publication No. 6-9824 discloses substantially the fundamental model as described above, but modified in that a detection coil for positional detection of the movable plate is connected to the driving coil.

Laid-open publication No. 6-310657 discloses an optical detector of the type in which the direction of the optical axis is variable, wherein the mirror in the galvanometer operated mirror disclosed in No. 5-320524 or No. 6-9824 is replaced by a photo-dedector element.

Finally, Laid-open publication No. 6-327369 discloses an electro magnetic actuator of the type, such as galvanometer operated mirror or optical axis variable type, in which a torsion bar is made of electro-conductive to form an electric connection, so as to prevent disconnection of the wir-ing pattern around the torsion bar caused by the repetition of torsional action of the torsion bar.

The electromagnetic actuator disclosed in Laid-open publication No. 6-310657 is described below as to the embodiment thereof.

Related Art 1

With reference to enlarged views of FIGS. 32 and 33, as the related art 1, the arrangement of "an optical detector of the type in which the direction of the optical axis is variable" is described. The examples of the related arts 1 to 3 hereinafter are all of the type which ope-rates by the same principle of the galvanometer. Also, the drawings including FIGS. 34 to 39 are all enlarged views.

In FIGS. 32 and 33, the optical detector 1 of the type in which the direction of the optical axis is variable is composed of a three-layered structure, including a silicone base 2 as a semiconductor subst-rate, and a pair of borosilicate glass bases 3 and 4 bonded on the upper and lower surfaces of the silicone base.

Here, there is the Joule's loss due to the resistance component in the coil, and sometimes the driving ability is limited due to generated heat, and, therefore, the flat coil 7 is formed by electroforming, comprising the steps of: sputtering a thin nickel layer on a substrate, forming thereon a copper layer by Cu electrolytic plating, and removing part of Cu and Ni layer leaving the coil pattern to form the flat coil, featured in forming the thin layer coil with low resistance and high density, providing the micromagnetic device with miniaturized and thinned profile.

On the upper central area of the coil, a pn photodiode 8 is formed in a known process, and a pair of electrode terminals 9, 9 connect to the flat coil 7 via the portion of torsion bar 6, where the terminals 9, 9 are formed simultaneously with forming of the flat coil 7.

On both sides, referring to FIG. 32, of substrates 3 and 4, each pair-formed annular permanent magnets 10A, 10B and 11A, 11B apply a magnetic field to the flat coil, on the region parallel with the torsion bar axis. Three pairs of magnets 10A, 10B, each pair therein being vertically arranged, are located such that the polarity is uniform, e.g., all N-poles locate lower sides, and S-poles upper sides as in FIG. 33. Similarly, the other three pairs 11A, 11B are located so as to have the polarity opposite to the above-mentioned pairs 10A and 10B.

Also, on the lower side of the glass base 4, a pair of coils are patterned and provided, which are connected to the paired terminals 13 and 14 (Schematically depicted by one dotted line in FIG. 32, but actually a plurality of turns). The detection coils 12A, 12B are located symmetrically relative to torsion bar 6, to detect the displacement angle of movable plate 5, and are located so that the mutual inductance between the flat coil 7 and detection coils 12A, 12B varies so as to increase when one of these approaches the other, and decrease when the other is away from the other. For example, by detecting the change of the voltage signal produced due to the mutual inductance, the displacement angle of movable plate 5 can be detected.

In operation, when a current is flowed across one terminal 9 and the other terminal 9 as + and − electrodes, respectively, a magnetic field is formed so as to cross the flat coil 7 as the arrows B in FIG. 34 shows. When a current flows via the coil 7, a force F is applied on flat coil 7, or, in other words, across the ends of movable plate 5, in the direction according to the Flemming's left-hand law, and such a force is obtained by the Lorentz' law.

The force F is obtained by the following formula (1), when i is current density flowing across the coil 7, and B is magnetic flux formed by the upper and lower magnets:

$$F=i*B \tag{1}$$

Actually, depending on the turn number n of coil 7, and the coil length w along which the force F is applied, the force F is again:

$$F=nw(i*B) \tag{2}$$

On the other hand, by rotation of movable plate 5, the torsion bar 6 is tilted, and the relation between the opposed spring force F' and the displacement angle φ of movable plate 5 is as follows:

$$\phi=(Mx/GIp)=(F'L/8.5*109\ r4)*11 \tag{3}$$

Where Mx: torsional moment, G: lateral elastic coefficient, Ip: polar sectional secondary moment. L, 11 and r are, respectively, the distance from the central axis to the force point, the length of the torsion bar, and the radius of torsion bar as shown in FIG. 34 .

As the movable plate 5 rotates until where the forces F and F' reach to their balanced state, the displacement angle varies in proportional with the current "I".

By controlling the current flowing via the coil 7, the object being monitored can be traced in a one-dimensional manner about an axis.

The induced voltage generated in detection coils 12A and 12B varies according to the displacement of optical detector element 8: thereby the detection of such voltage allows to detect the optical axis displacement angle φ of the detector element 8.

Also, by the arrangement in FIG. 35 as including a differential amplifier circuit, the optical axis displacement angle φ can be controlled in a precise manner.

In the above-describe Related art, the movable assembly can be typically small-sized and light-weight. No compensation for the dispersion of component parts is required.

Related Art 2

An "optical axis direction variable-type photo-detector" is shown in FIG. 36, compared with the Related art 1, a two-axis photo-detector is provided, having a pair of torsion bars perpendicular with each other.

In FIG. 36, the optical axis direction variable-type photo-detector 21, having the three layered construction, includes a silicon substrate 2 and a pair of upper and lower glass substrates 3, 4 bonded together. On each center of substrates 3 and 4, a pair of rectilinear recesses 3A, 3B are formed. The glass substrates 3, 4 each is bonded on the silicon substrate 2 in the manner that the upper glass substrate 3 is placed on the Si substrate 2 with the recess 3A on the lower side to be bonded thereon, while the lower glass substrate 4 is placed with the recess 4A on the upper side to be bonded on the Si substrate 2. As a result, a space is provided, in which the movable plate 5 having a detection element 8 thereon is allowed to rock therein.

In operation, a current flowed across the coil 7A causes the ext-ernal movable plate 5A to rotate around the first torsion bars 6A, 6A according to the current direction, wherein the internal movable plate 5B also rotates integrally with the external movable plate 5A, and the photodiode 8 operates in the same manner as the case of the Related art 1.

The object to be monitored can be traced in a two-dimensional manner.

Related Art 3

As shown in FIGS. 37, 38 and 39, an optical axis direction variable-type photo-detector is provided. Different from the Related art 2, either of glass substrates 3, 4 is formed in a flat shape having no recesses 3A, 4A. Instead, a rectilinear opening 3a is formed in the movable plate 3 for allowing the detection light to directly enter the photodiode 8.

Variations

Other variations are possible for the optical detector element instead of a photodiode, such as a line sensor or an area sensor, each comprising a plurality of photodiodes. Also, phototransistors, photo-conductors, or CCD may be employed. As necessary, microlens for converging the incident light is provided in front of the optical detector element.

BRIEF DESCRIPTION OF THE DRAWINGS

FIG. 4 is the additional illustrative view (No.3) of the production process of the embodiment 1;

FIG. 15 is an illustrative view No.2 of the production process of embodiment 3;

FIG. 22 is an illustrative view No.3 of the production process following to FIG. 20;

FIG. 27 is an illustrative view of the assembly process of embodiment 7;

DETAILED DESCRIPTION OF THE PREFERRED EMBODIMENTS

Embodiment 1

Figure 1:
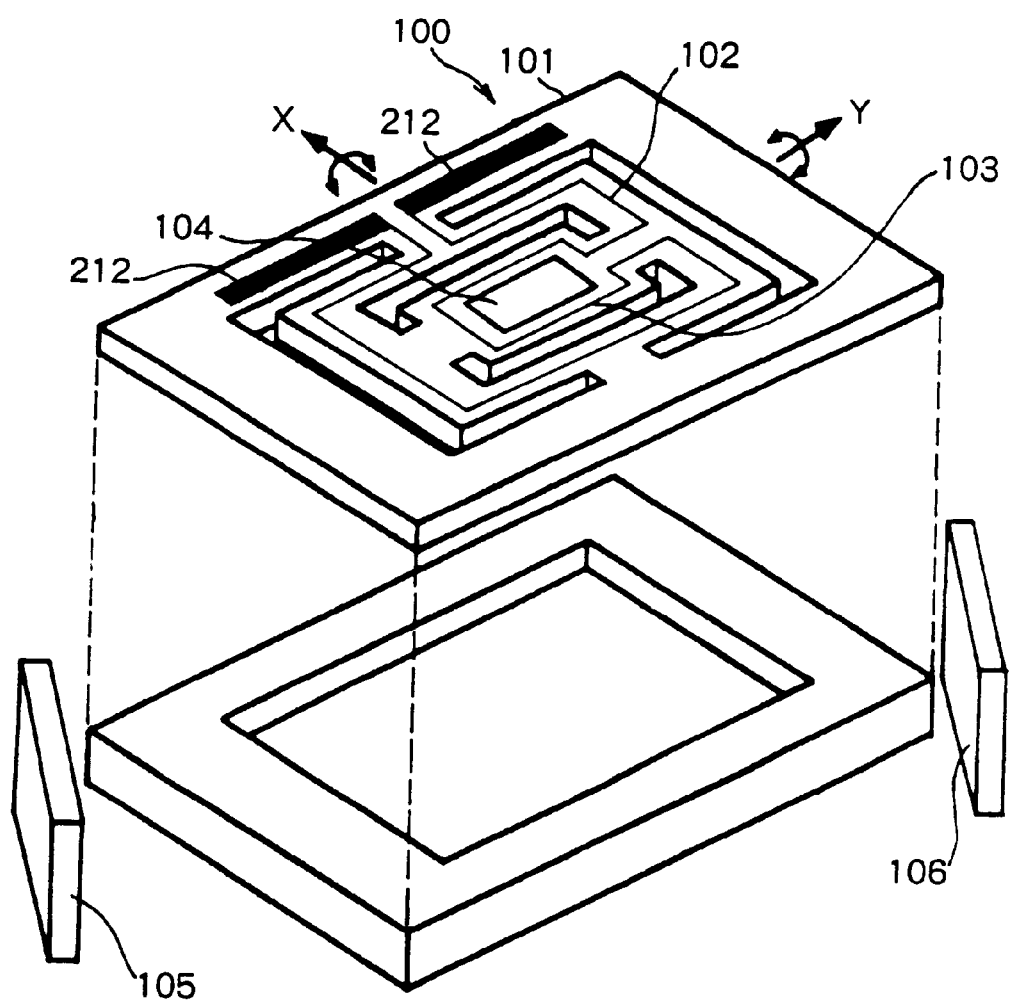
FIG. 1 is a perspective view of an embodiment 1 of the invention.

FIG. 1 shows a summary view of an embodiment of an electromagnetic actuator 100, in which the direction of the optical axis of an optical unit (including a mirror, light receiving element, light emitting element, etc) 104 is allowed to swing within a two-dimensional surface, wherein a first and a second driving coils 102 and 103, respectively, are each a one-turn coil of thin film, and connected in series to each other.

The embodiment differs from the Related Art 2 in construction of the driving coil, in arrangement of the permanent magnet, and in the method of actuating the electromagnetic actuator. But the modified arrangement of the magnet does not cause a variation of the function as an electromagnetic actuator, and rather provides advantages, by utilizing a component of magnetic flux perpendicular to the driving coil, to reduce the number of permanent magnets, to simplify the construction and reduce the production cost.

The process of producing the electromagnetic actuator is described in reference to FIGS. 2 to 4, wherein the thickness is exaggerated relative to the horizontal dimension for clarity, as is the same in FIGS. 6 and 7 described hereinafter.

Figure 2:
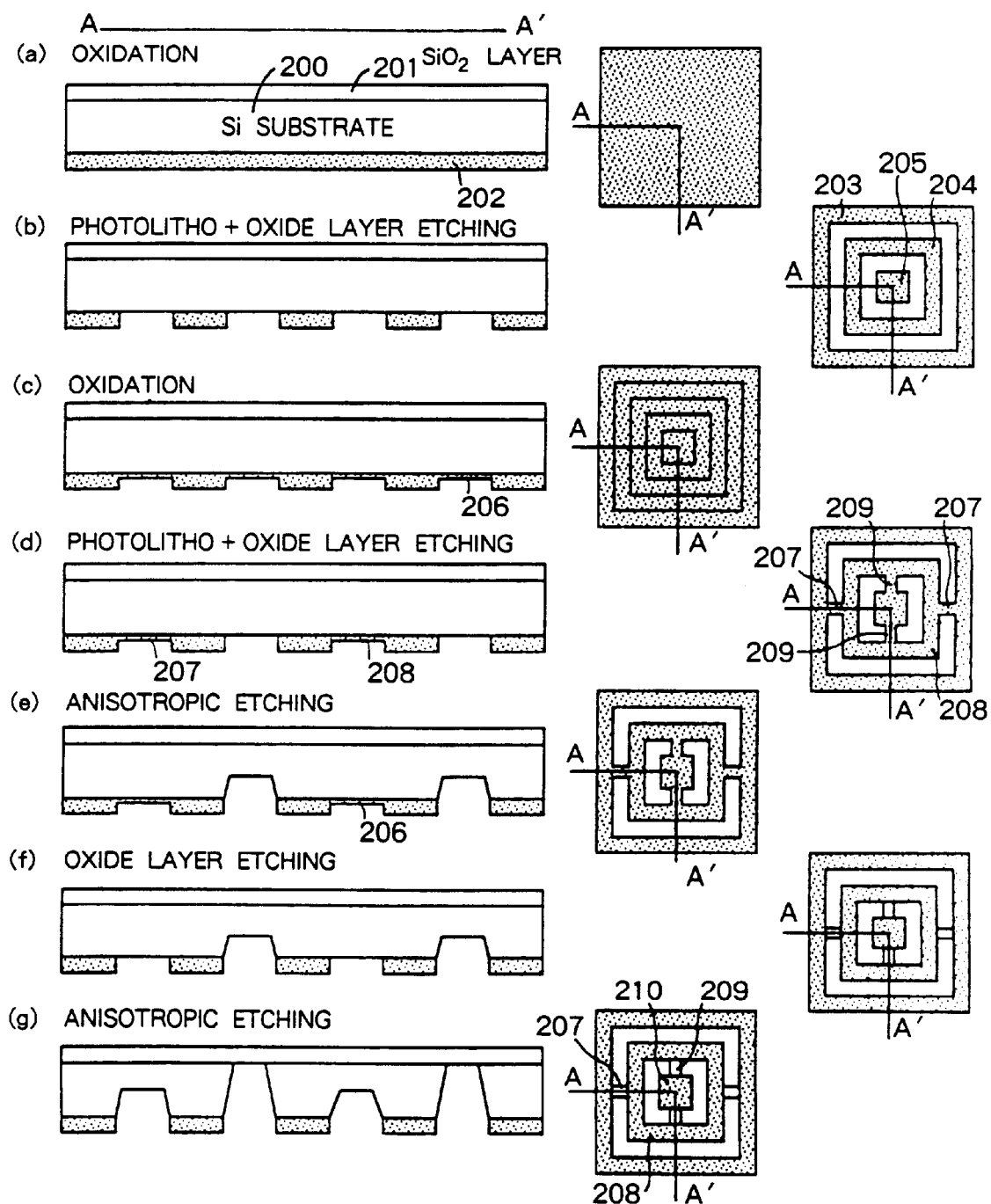
FIG. 2 is an illustrative view (No.1) of the production process of the embodiment 1.
Figure 3:
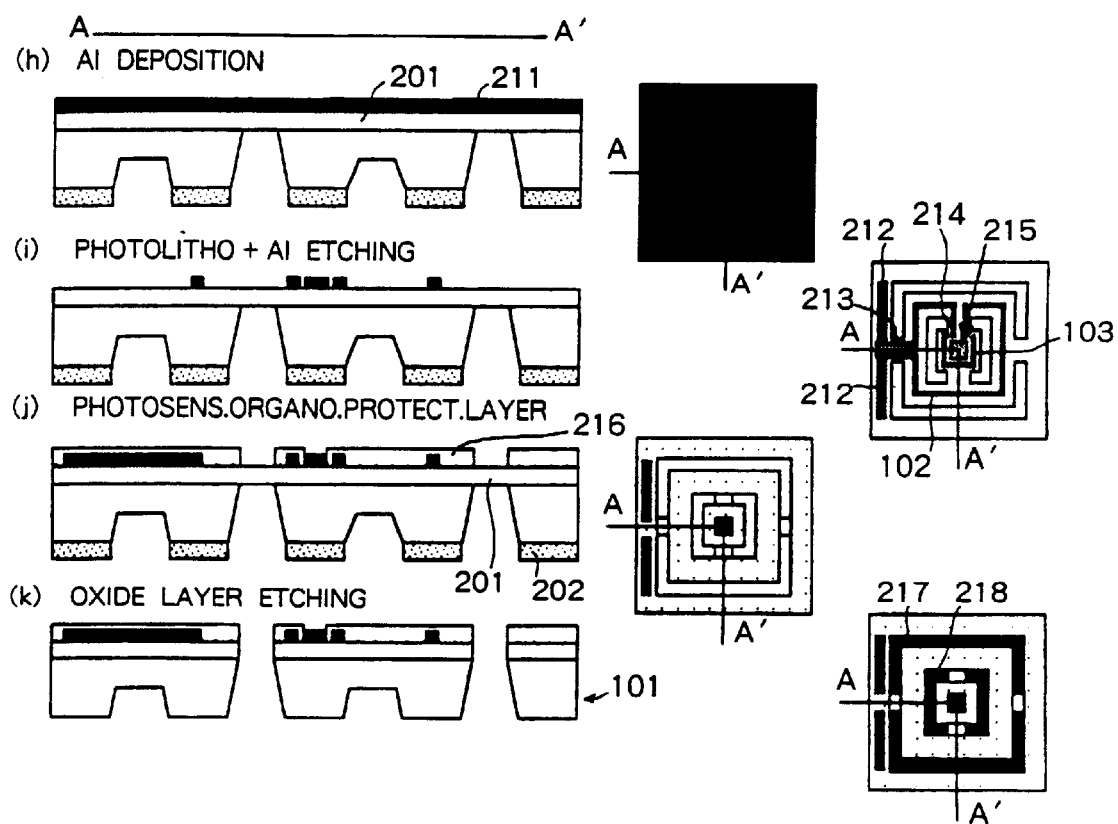
FIG. 3 is the additional illustrative view (No.2) of the production process of the embodiment 1.

The right side figures in both of FIGS. 2 and 3 are plan views, and left side figures are sections taken along lines A–A' of the right side Figures. In step (a), oxide layers 201 and 202 are formed on the upper and lower surface of a silicone substrate 200. In step (b), the oxide layer 202 is partial-ly removed by photolithography and oxide-layer etching, but leaving a peripheral area 203, an external movable area 204 and an internal mova-ble area 205. In step (c), a thin oxide layer 206 is formed on the areas where the oxide layer has been removed in step (b). In step (d), the oxide layer 206 is partially removed by photolithography and oxide-layer etching, but leaving the areas of a first torsion bar 207 and a second torsion bar 209. In step (e), the areas removed in step (d) is processed by anisotropic etching. In step (f), the oxide layer still remaining is removed. In step (g), by anisotropic etching, a first torsion bar 207, external movable plate 208, second torsion bar 209 and an internal movable plate 210 is formed.

In step (h), aluminum layer 211 is formed on the oxide layer 201 of the upper surface of silicon base 200 by aluminum evaporation. In step (i), the aluminum layer 211 is partially removed by photolithography and aluminum etching to simultaneously form a terminal 212, a wiring 213 on the first torsion bar, a first driving coil 102, a wiring 214 on the second torsion bar, a second driving coil 103, and a mirror 215 as an optical element.

As can be seen, the first and second driving coils are connected in series, and connected to terminal 212.

In step (j), an organic protective layer is formed by photoli-thography so as to surround the first and second driving coils 102 and 103. In step (k), the oxide layers 217, 218 and 202 are removed by oxide layer etching, including one 217 intermediate between the fringe area 203 and external movable plate 208, another oxide layer 218 between the external and internal movable plates 208 and 210, and the remaining oxide layer 202, to form a chip 101.

In step (1), the chip 101 above is placed on and bonded to a separately prepared silicone base 220 having a recessed region 219 in the middle thereof, and in step (m), a pair of permanent magnets 105 and 106 are mounted in diagonal relationship to complete an electromagnetic actuator 100.

To operate the electromagnetic actuator 100, in which the first and second driving coils are connected in series to each other, and both coils are driven by the same current flow, different from the Related Art 2. Therefore in the invention, utilizing the difference between the resonant frequencies of the external movable plate 208 driven by the first driving coil 102 and internal movable plate 210 driven by the second driving coil 103, the external and internal movable plates are separately driven so as to allow the optical element 104 on the internal plate 210 to swing in two-dimensional directions, i.e., about two orthogonal axes.

Figure 5:
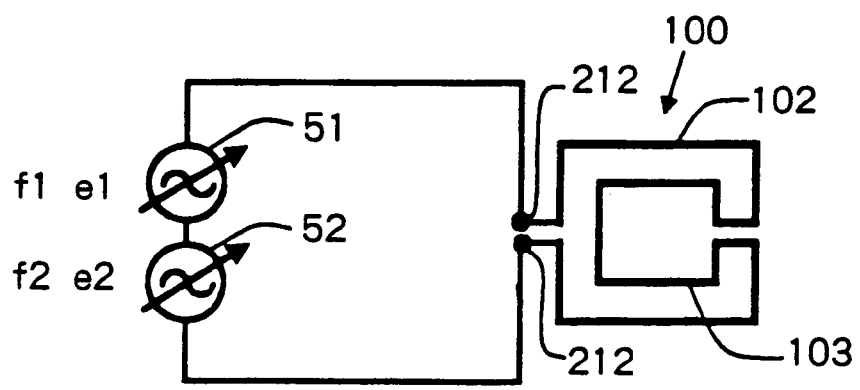
FIG. 5(a) is a schematic view describing the driving process of the embodiment 1.
FIG. 5(b) is a diagram useful for explaining the operation of the embodiment of FIG. 5(a)
Figure 5:
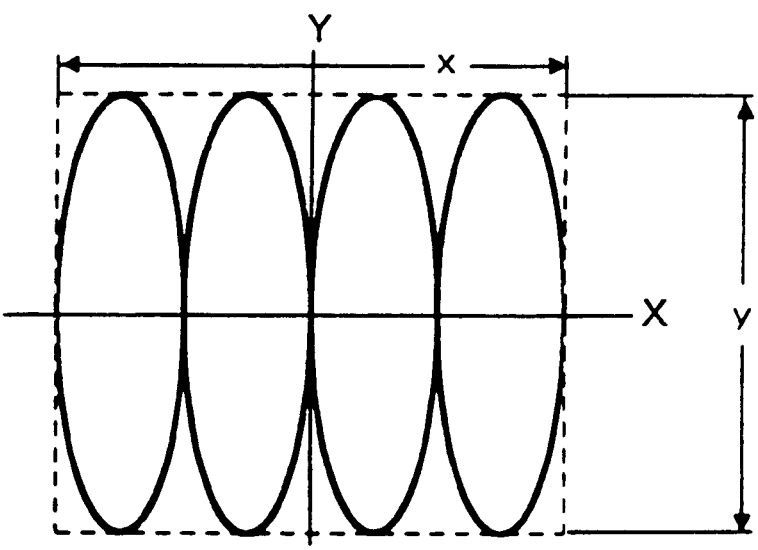

Suppose that the resonant frequency of the external and internal movable plates are, respectively, 400 and 1600 Hz. As shown in FIG. 5(a), the variable sinusoidal altenating source 51 having 400 Hz(f1) and an output voltage e1, and the variable sinusoidal altenating source 52 having 1600 Hz(f2) and an output voltage e2, are connected in series and further connected to the terminal 212 of the electromagnetic actuator 100.

As a result, the external movable plate 208 is activated by the voltage generated from the a.c. source 51 and is resonated in oscillation at 400 Hz relative to X-axis, while the internal movable plate 210 is also activated by the voltage generated from the a.c. source 52 and is resonated in oscillation at 1600 Hz relative to Y-axis. Thus, as shown in FIG. 5(b), the direction of the optical axis of the optical element 104 oscillates in the two-dimensional manner as a Lissajous figure traces. When the ratio between the resonant frequencies of external and internal movable plates is set to be an integer, the Lissajous figure turns to move with the time, and thus fine scanning becomes possible. The swing in the X-direction varies in accordance with changing the voltage of the a.c. source 51, while the swing in the Y-direction varies in accordance with changing the voltage of the a.c. source 52. The mechanical Q of the movable plate of the electromagnetic actuator of this type at a resonant state is high, and the amplitude is substantially decreased, when the source frequency varies even by several Hz. Accordingly, neither the internal movable plate 205 would be activated to oscillate by a.c. source 51, nor the external movable plate 208 would be activated to oscillate by ac source 52. Also, because of utilizing resonance, and because it is impossible to detect the displacement angle of the movable plate by means of a detecting coil to feedback control the dis-placement angle, a coil for detection is not needed.

The arrangement shown in FIG. 5(a) is an example of actuation with a voltage source having a small internal impedance, while, when actuated by a source having a large internal impedance, both voltage sources are normally connected to the terminal 212.

As discussed above, in the present embodiment, since the coils are connected in series with each one turn, the number of terminals, of wiring on each torsion bar, or of turns of each driving coil is reduced, thereby the construction being largely simplified. Since the coils, terminals, the wiring of torsion bars, and the mirror, are all formed by photolithography and aluminum etching, the number of masks needed for the process is largely reduced to simplify the production processes with lowered costs.

As the wiring on driving coils and torsion bars, formed of deposited aluminum layer, are thin enough and soft compared with the copper layer prepared by electroforming coil method as that in the Related Art 2, the characteristics are stably maintained for a long period of life.

Embodiment 2

In the present embodiment, there is no need of providing the second driving coil so as to have a one-turned closed circuit, or recesses as is in embodiment 1, or spacers as is in Related Art No.3.

Figure 6:
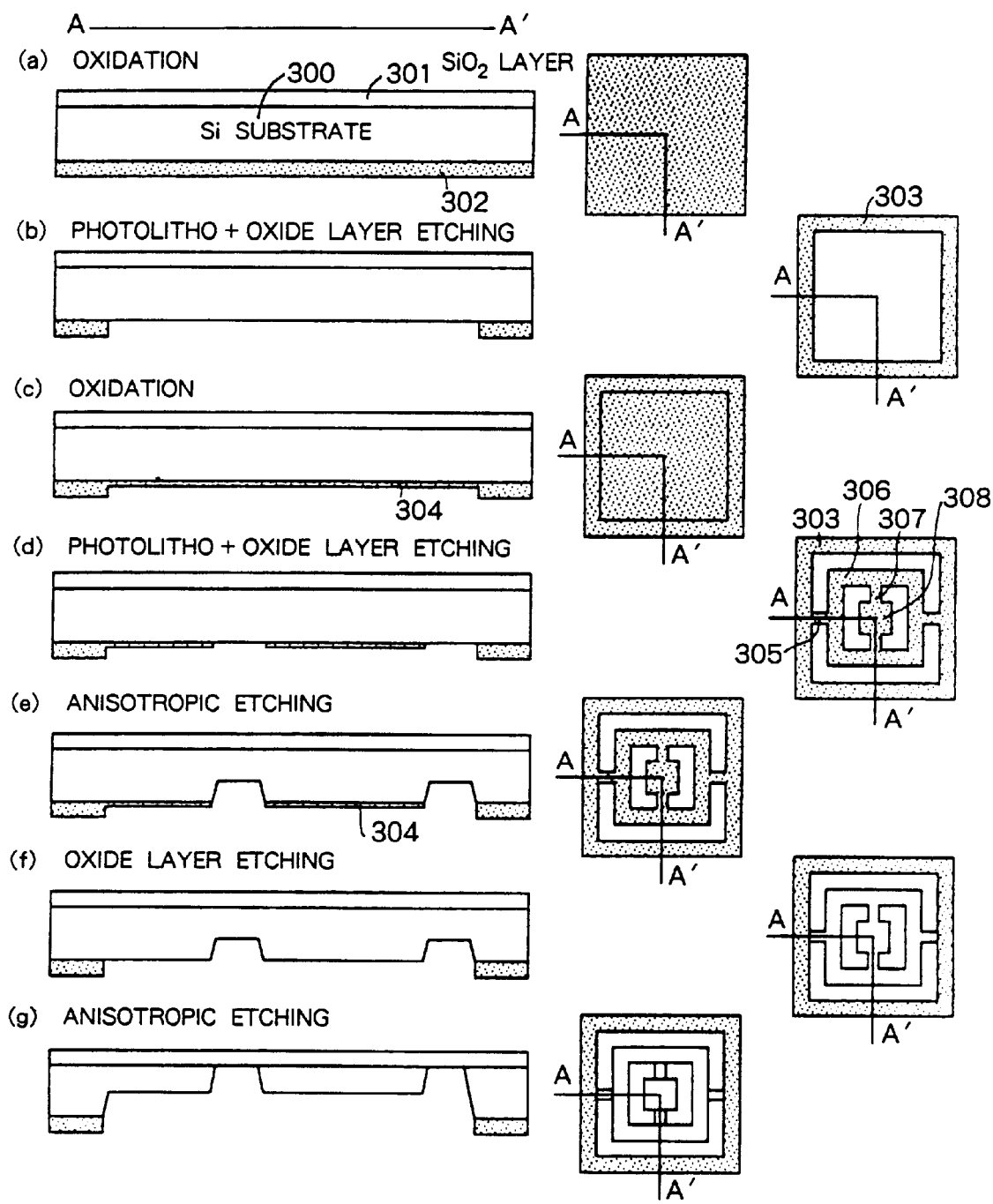
FIG. 6 is an illustrative view (No.1) of the production process of an embodiment 2.
Figure 7:
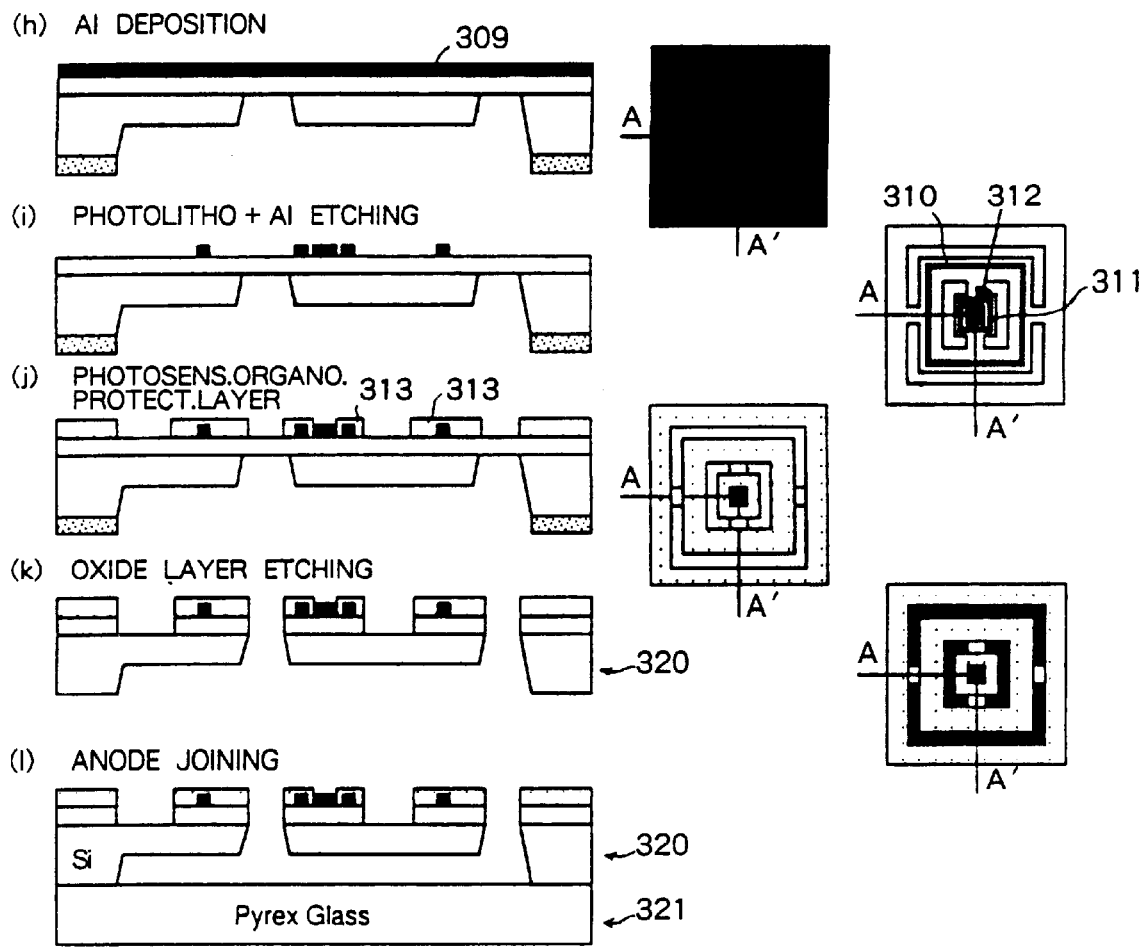
FIG. 7 is another illustrative view of (No.2) of the production process of the embodiment 2.
Figure 8:
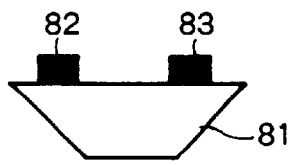
FIGS. 8(a) and (b) each is an end view illustrating wiring formed on the torsion bars.
Figure 8:
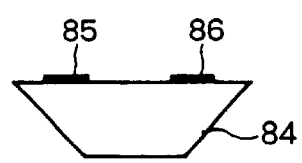

The process of manufacturing the embodiment is described referring to FIGS. 6 and 7, comprising the steps of:

(a) forming oxide layers 301 and 302 on both surfaces of silicon substrate 300;
(b) partially removing the oxide layer 302 by photolithography and oxide layer etching, leaving the peripheral area 303;
(c) forming a thin oxide layer 304 on the area of which the initial oxide layer has been removed;
(d) removing the oxide layer 304 by the same process as above, but leaving regions including the first torsion bar 305, external movable plate 306, second torsion bar 307 and internal movable plate 308;
(e) providing anisotropic etching on the area removed at the foregoing step (d);
(f) removing the still remaining oxide layer 304 by oxide layer etching; and
(g) further providing anisotropic etching on the lower surface.

In step (h), aluminum layer 309 is formed on the oxide layer 301 by aluminum deposition.

In step (i), the aluminum layer 309 is partially removed by photolithography and aluminum etching to simultaneously form a first driving coil 310 formed of a one-turned loop, a second driving coil 311 also formed of a one-turned loop, and a mirror 312 as an optical element.

In step (j), an organic protective layer is formed by photolithography so as to surround the first and second driving coils 310 and 311.

In step (k), the unneeded region of the oxide layer 301 is removed by oxide layer etching to form a chip 320.

In step (l), the tip 320 above is placed on and bonded to a separately prepared Pyrex glass base 321 by anode bonding.

The herein referred anode bonding is a technique such that, with the silicon and glass bases facing together with each of smooth surfaces, after heated up to 400° C. a 100 V negative voltage is applied on the glass side to bond with each other, wherein an ionic deviation in the glass base is caused, and are bonded together, by way of a static attractive force produced between the silicon and glass bases and chemical bonding between the boundary surface.

Since the first driving coil 310 and second driving coil 311 are both formed of a one-turned loop, having no terminals derived therefrom, these are energized by wireless process. For this purpose, a primary coil is provided: by connecting across the primary coil an alternating current source having a frequency resonant with that of the internal movable plate to energize the internal movable plate. Thus the optical axis of the optical element 312 is allowed to swing in the manner of two-dimensional basis i.e., in two orthogonal directions.

As described above, since both the driving coils are formed of a one-turned loop and no wiring is needed, the construction thereof is largely simplified compared with the Related Art 2 or the like. In addition, since all that including driving coils and the mirror are formed by aluminum deposition and etching, the necessary number of masks is halved and the process is largely simplified to lead to improved yield and lowered cost.

Also, due to the aluminum deposited layer for the driving coils, the stable characteristics and long life are expected.

MODIFIED FORMS

In a structure having a single movable plate as the Related art 1, instead of other arts having two movable plates, the construction is also simplified.

Embodiment 3

Figure 9:
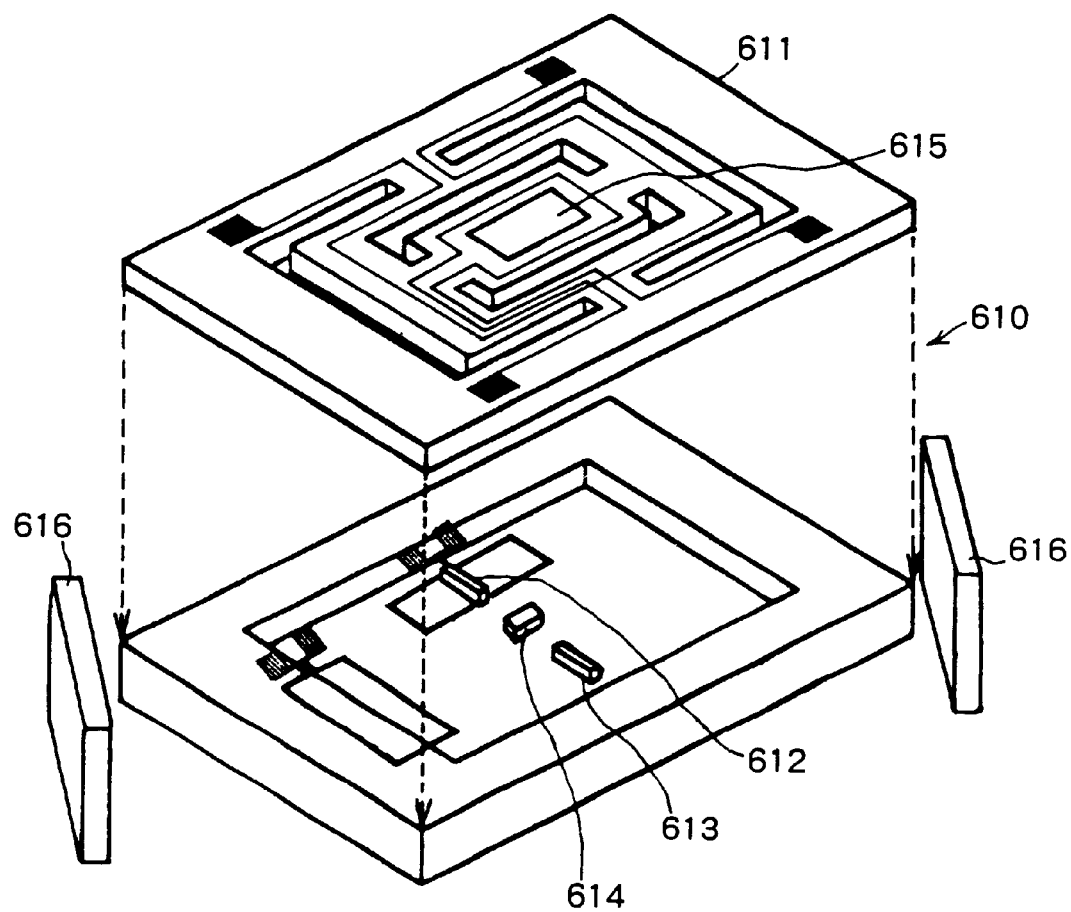
FIG. 9 is a perspective view of an embodiment 3.

Shown in a summarized view of the embodiment of FIG. 9, the embodiment is an example in which stoppers 612 and 613 for external movable plates as well as a stopper 614 for the internal movable plate are provided, for preventing damage of torsion bars caused by external shocks.

Other than provided with stoppers, the arrangement of permanent magnets is also different fromt hat of the Related Art 2. Yet, there is no particular difference in function as the electromagnetic actuator. Rather, according to the arrangement, utilizing the component of magnetic flux parallel to the driving coil, the number of permanent magnets is reduced, the construction is simplified, and the low cost can be realized.

FIG. 9 shows a summary view of an embodiment of an electromagnetic actuator, in which the optical element 615 is caused to oscillate in the two-dimensional manner, similar to the actuator 610 in Related art 2, The principal structure and function are substantially the same as those of Related art 2. Therefore, hereinafter described is the stopper.

Figure 11:
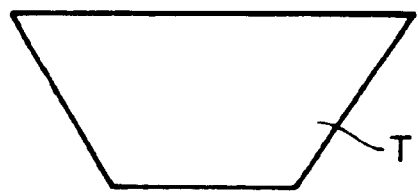
FIGS. 11(a), 11(b) and 11(c) are fragmentary views of a torsion bar.
Figure 11:
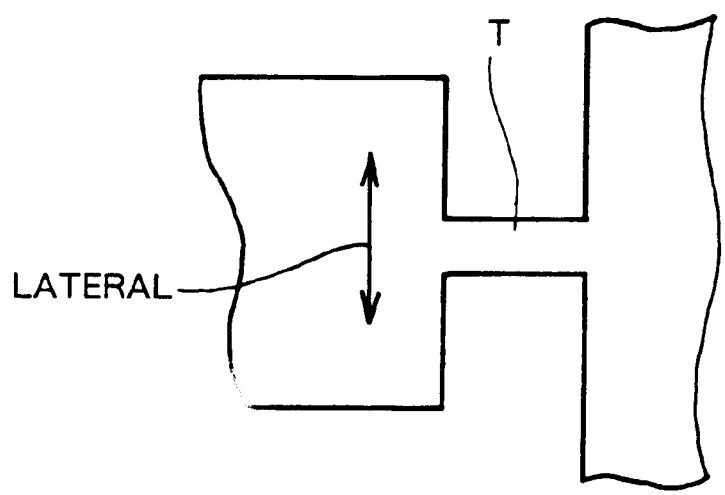
Figure 11:
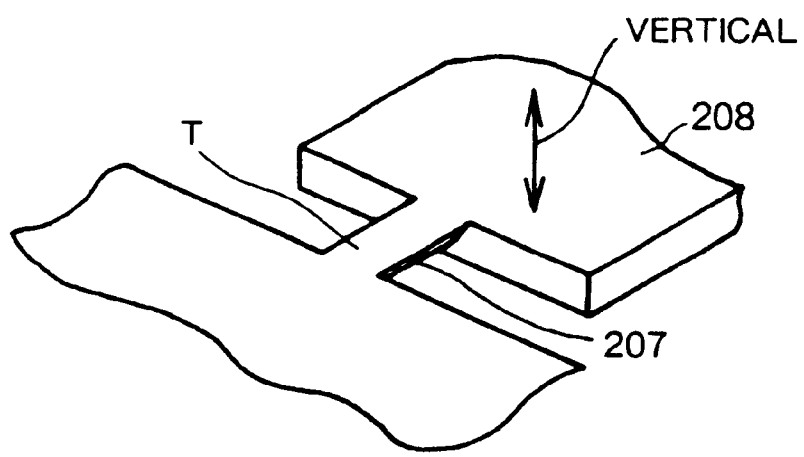

In such an actuator, the torsion bar for swingably supporting the movable plate is constructed as shown in FIG. 11, including (a) a sectional view, (b) a plan view and (c) a perspective view. As will be found in FIG. 11, the torsion bar $\Delta y$ is strong in the lateral direction, but weak in the vertical direction.

Figure 12:
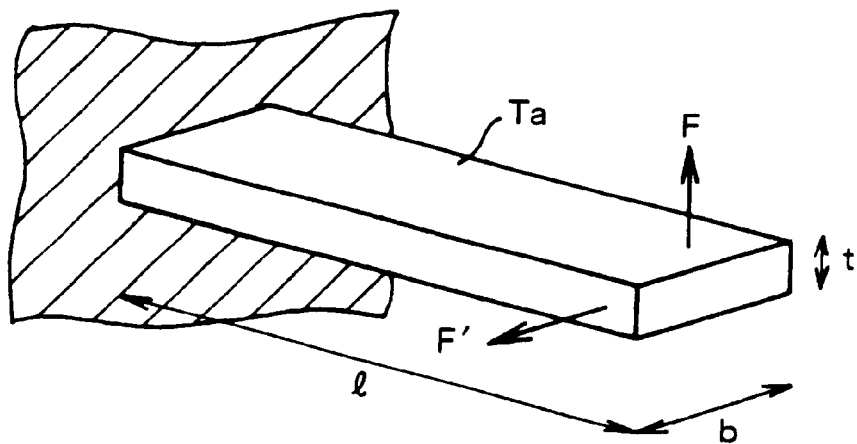
FIG. 12 is a fragmentary view of a cantilever.

The reason may be discussed in connection with a cantilever shown in FIG. 12. When a force F is applied to the end of a cantilever, the displacement $\Delta y$ is represented by:

$$\Delta y = 4 \times 1^3/(Gbt^3) \times F$$

Also, when a force F' is applied to the end of the cantilever, the displacement $\Delta y'$ is $$\Delta y' = 4 \times 1^3/(Gtb^3) \times F$$

Suppose that b=3t, and F=F':

$$\Delta y = 4 \times 1^3/(G.3t.t^3) \times F = 1/3(4.1^3/G.t^4) \times F$$

$$\Delta y' = 4 \times 1^3/(G.t.27t^3) \times F = 1/27(4.1^3/G.t^4) \times F$$

Where G is the lateral elastic coefficient. As a result:

$$\Delta y' = 1/9.\Delta y$$

The displacement in the lateral direction is less than that in the vertical direction, and this shows the cantilever is stronger in the former direction than the other.

Figure 13:
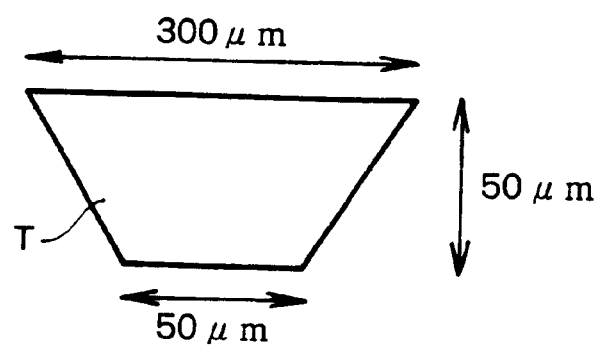
FIG. 13 is another view of a torsion bar.

Since a torsion bar made by the Si wafer is shaped as shown in FIG. 13, it is supposed to be weaker by a lateral shock than by a vertical shock, and it is found to be preferable to prevent an excessive displacement caused by the vertical shock.

As the first method therefor, a stopper may be provided below the movable plate to reduce the probability of damage of the torsion bar.

Another method is to reduce the mass of the movable plate to decrease the F, even if the equal amount of acceleration is exerted thereon, according to: F=ma This second method is effective not only for the lateral but vertical directions. By applying two methods at the same time, further increase of anti-shock and anti-vibration is expected.

Figure 14:
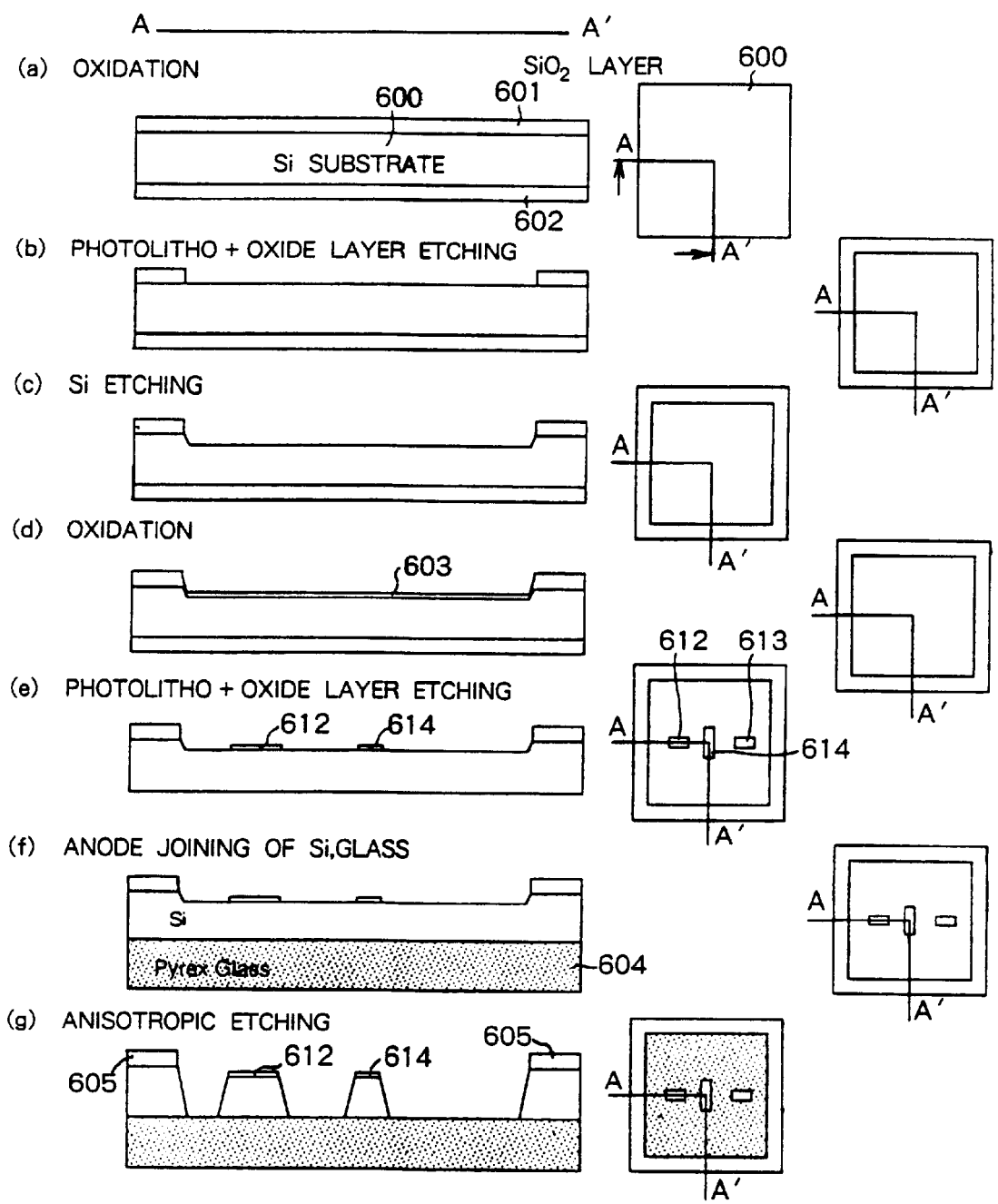
FIG. 14 is an illustrative view No.1 of the production process of the embodiment 3.

Utilizing the first method, FIGS. 14 and 15 shows the production process of embodiment 3. For ease of comprehension, the thickness direction is exaggerated in these figures, also the same in FIGS. 16 to 22.

FIGS. 14(a) to (g) show plan views on the right side, and each sectional view taken along lines A–A' viewed from the arrow direction. In each of steps: (a) an oxide layer 601 is formed on both faces of Si substrate 600, (b) part of oxide layer 601 is removed by photolithography and oxide layer etching, (c) the Si surface from which the oxide layer 601 has been removed is further etched. (d) oxidizing the etched Si surface to form a thin oxide layer 603; (e) selectively removing the oxide layer 603 by photolithography and oxide layer etching, so as to leave the regions of stoppers 612 and 613 for the external movable plates and of the stopper 614 for the internal movable plate; (f) bonding a Pyrex glass plate 604 onto the surface of Si substrate 600, on which no stoppers 612, 613 and 614 are formed, by anode bonding method; (g) anisotropically etching the Si substrate 600, so as to leave the regions of tip support 605, and stoppers 612, 613 and 614; and (h) removing the oxide layer 603 of tip support 605, and stoppers 612, 613 and 614 to obtain a support member 700 by etching.

Figure 10:
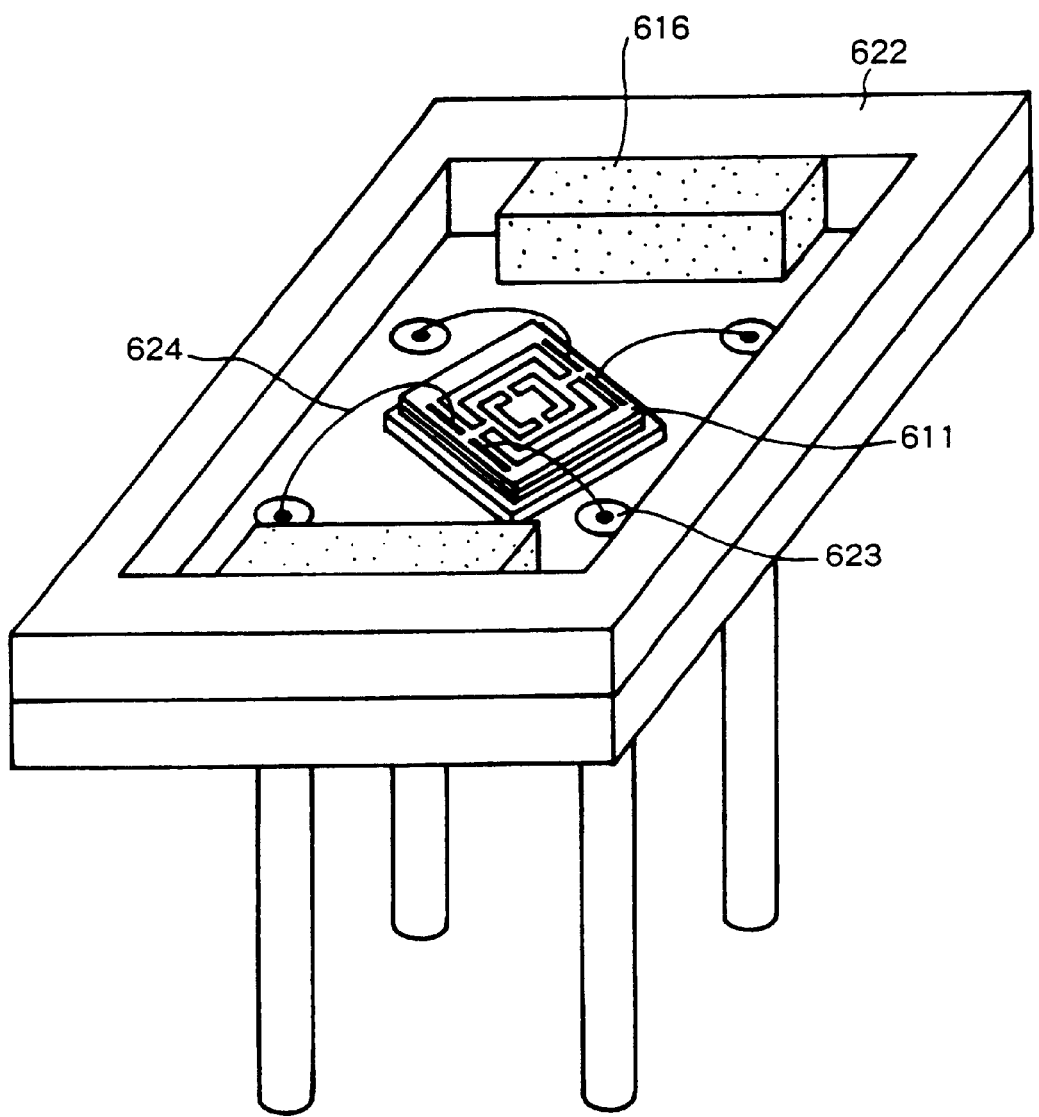
FIG. 10 is a perspective view showing the magnet arrangement.

Further, the steps include (i) bonding the chip 611 including the separately fabricated movable plate, torsion bar and driving coil, etc. onto the support 700 formed as above-mentioned; and (j) mounting permanent magnets 616 to complete the electromagnetic actuator. More specifically, as shown by FIG. 10, by arranging the chip 611 and permanent magnets 616 in a package as the yoke 622 in position as illustrated, completing a necessary connection by the wire 624, thus the actuator 610 is completed.

"Anode plating" is a technology in which each flat surface of a silicon substrate and glass substrate are attached together, heated at 400° C., and applied with a negative voltage of 100 V to complete bonding. The ionic deviation which occurs herein causes a static electrical force between the silicon and glass substrates, which are bonded together due to chemical binding produced on the interface.

As shown in FIG. 9 and step (j) in FIG. 15, the actuator is provided with a plurality of, such as three, beam-like shaped stoppers opposed to one side of movable plates and outside of the range in which the movable plates are swingable. By provision of such stoppers 612, 613 and 614, an excessive deformation of movable plates and damage of torsion bars are properly prevented, even in the event that the movable plates receive an external shock or are driven in excess due to unknown causes. The method is called "Second method".

Embodiment 4

Figure 16:
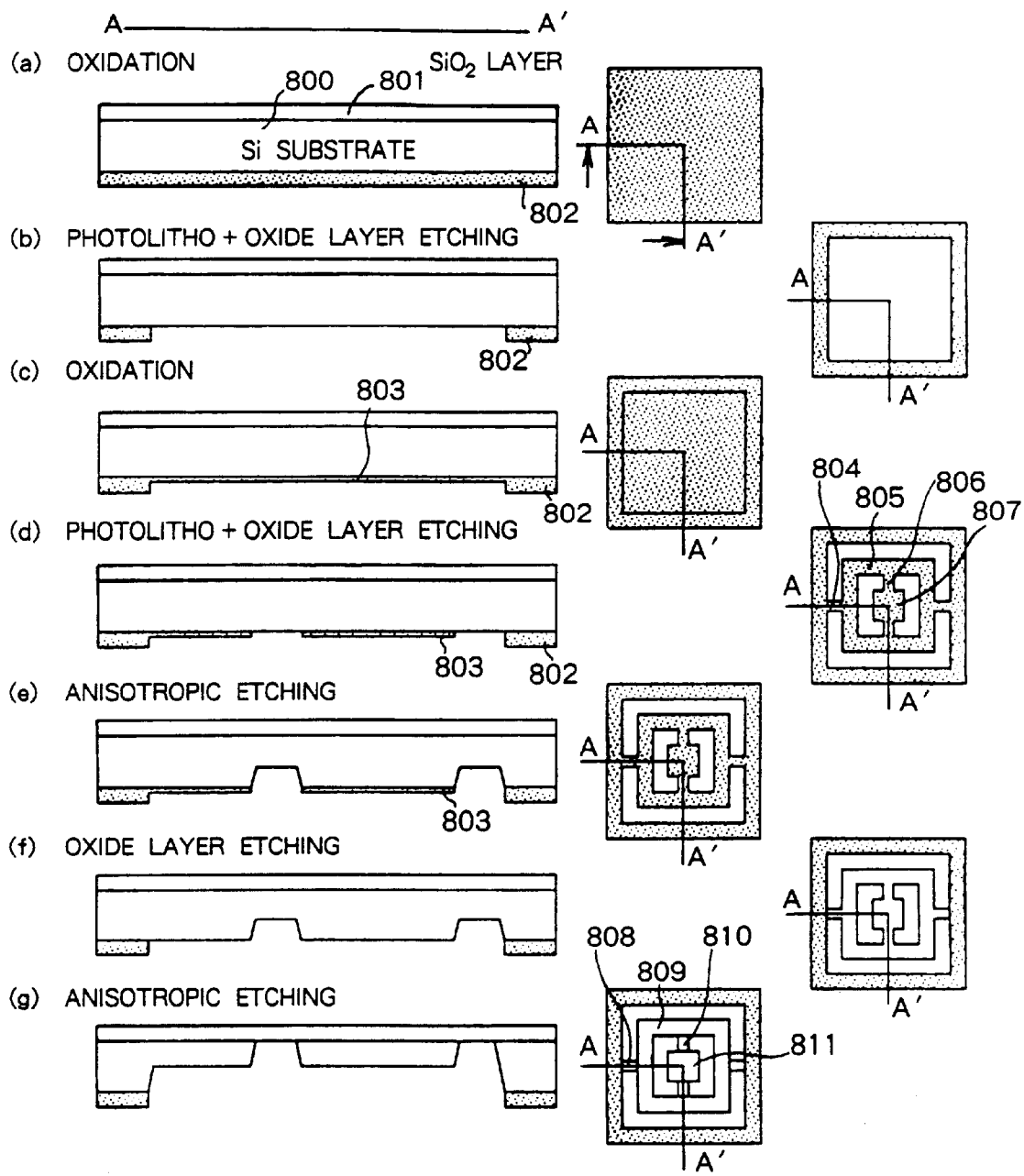
FIG. 16 is an illustrative view No.1 of the production process of an embodiment 4.
Figure 17:
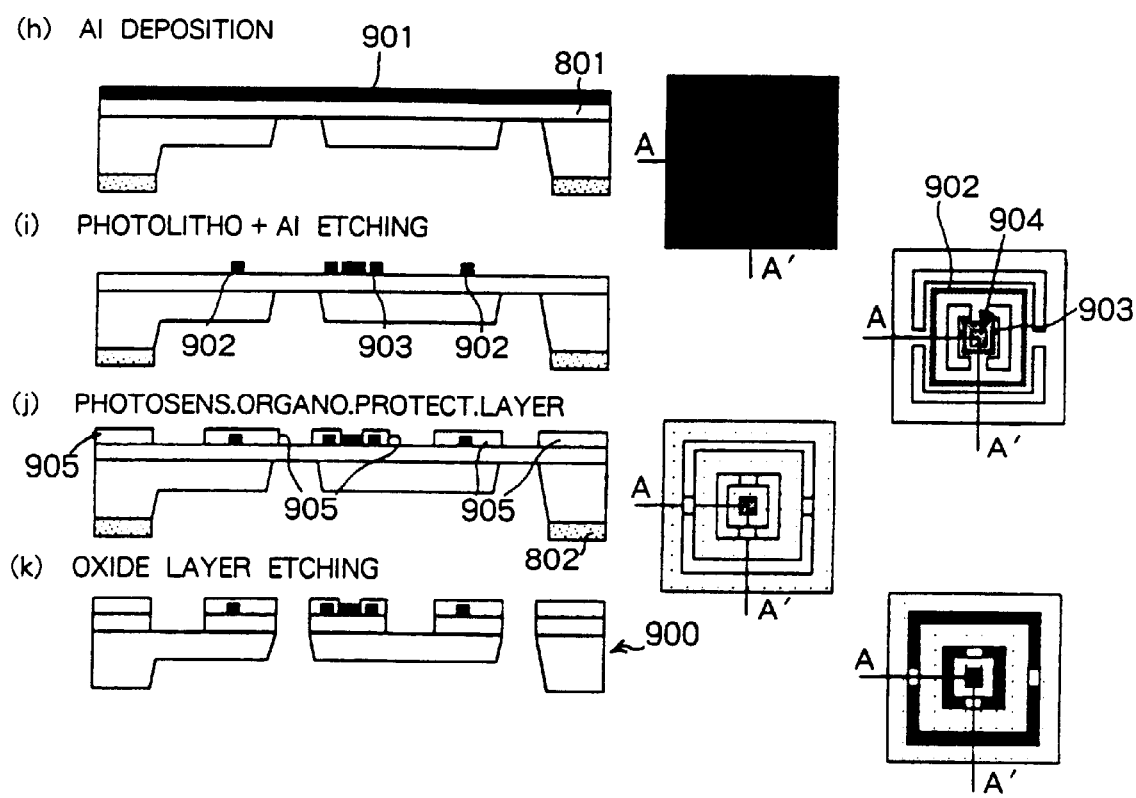
FIG. 17 is an illustrative view No.2 of the production process of embodiment 4.

FIGS. 16 and 17 show the process sequence of the embodiment 4 similar to embodiment 3 and Related art 2, but is another example in which the "Second method" above is applied, thereby also to reduce the mass of movable plates and to prevent damage of torsion bars.

More specifically, when using a silicon wafer having a thickness of 200 microns with the movable plate etched to the thickness of 50 microns, then the mass of the movable plate reduces to ¼ compared with the conventional. With the acceleration a caused by an external shock, and the mass m is replaced by ¼.m, therefore the force F is:

$$F = ¼.m\ \alpha$$

Hence, the force F applied on the movable plate reduces to ¼, the probability of damage of the torsion bar is largely reduced.

The silicon wafer having a thickness of 200 microns is used herein, and the region of movable plates is etched to reach the -thickness of 100 microns. The process sequence includes the steps of:

(a) forming oxide layers 801 and 802 on upper and lower faces of Si substrate 800 of 200 microns in thickness by oxidation;
(b) removing part of oxide layer 802 by photolithography and oxide layer etching;
(c) forming a thin oxide layer 803 by oxidation;
(d) selectively removing the oxide layer 803 by photolithography and oxide layer etching, so as to leave the regions including the first torsion bar 804, external movable plate 805, second torsion bar 806 and internal torsion bar 807;
(e) further anisotropically etching the portion already oxide-layer etched in step (d);
(f) removing the still remaining oxide layer 803 by oxide layer etching;
(g) anisotropically etching the Si substrate 800 to form a first torsion bar 808, external movable plate 809, second torsion bar 810 and internal movable plate 811;
(h) forming aluminum layer 901 on oxide layer 801 by aluminum deposition;
(i) partially removing aluminum layer 901 by photolithography and aluminum etching to simultaneously form a first driving coil 902 or the external movable plate 809 periphery, a second driving coil 903 on the internal movable plate periphery, and a mirror 904 as an optical element;
(j) selectively forming an organic protective layer 905 by photolithography so as to cover the periphery, and the first, second driving coils 902 and 903; and
(k) removing the unnecessary oxide layer 802 by oxide layer etching to complete a chip 900 forming the main part of an electromagnetic actuator. Thereafter, the chip 900 is interposed between the upper and lower glass substrates, a permanent magnet is mounted, and thus the electromagnetic actuator is assembled.

As described, the movable plates are of thin films formed from the Si substrate to reduce their mass and the stress applied when receiving a shock. As a result, an excessive deformation of movable plates and damage of torsion bars are prevented.

Embodiment 5

Figure 18:
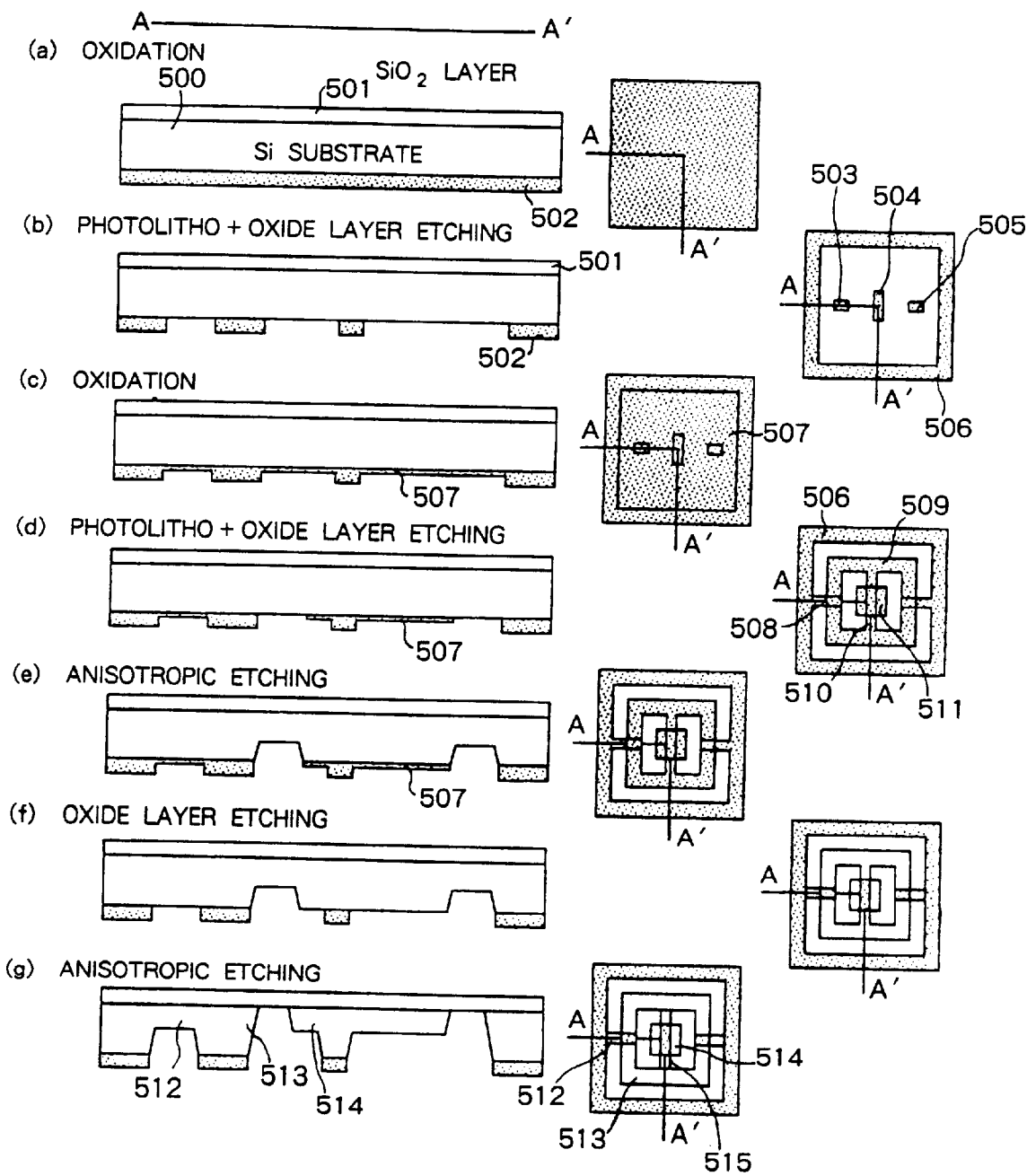
FIG. 18 is an illustrative view No.1 of the production process of an embodiment 5.
Figure 19:
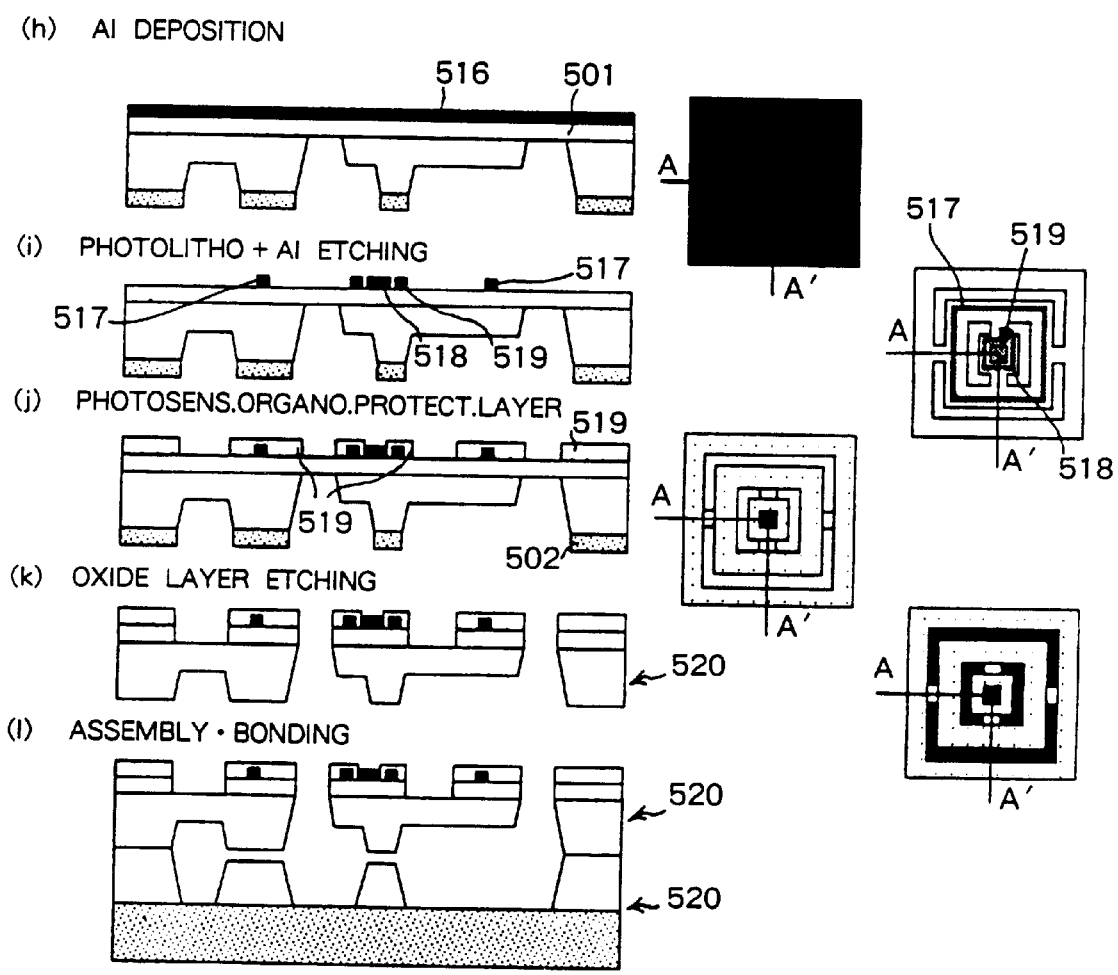
FIG. 19 is an illustrative view No.2 of the production process of embodiment 5.

FIGS. 18 and 19 show the process sequence of the embodiment 5 featured in combining provision of stoppers and reduction of the mass of movable plates, including the steps of:

(a) forming oxide layers 501 and 502 on upper and lower faces of Si substrate 500 of 200 microns in thickness by oxidation;
(b) selectively removing the oxide layer 502 by photolithography and oxide layer etching, so as to leave the regions including stoppers 504 and 505 and peripheral region 506;
(c) forming a thin oxide layer 507 by oxidation;
(d) selectively removing the oxide layer 503 by photolithography and oxide layer etching, so as to leave the regions including the periphery 506, the first torsion bar 508, external movable plate 509, second torsion bar 510 and internal movable plate 511;
(e) further anisotropically etching the portion from which the oxide layer 507 has been removed in step (d);
(f) removing the still remaining oxide layer 507 by oxide layer etching; and
(g) anisotropically etching the Si substrate 500 to form a first torsion bar 512, external movable plate 513, internal movable plate 514 and second torsion bar 515.

Further steps include:
(h) forming aluminum layer 516 on oxide layer 501 by aluminum deposition;

(i) partially removing aluminum layer 516 by photolithography and aluminum etching to simultaneously form a first driving coil 517 on external movable plate periphery, a second driving coil 518 on internal movable plate periphery, and a mirror 519 as an optical element;

(j) selectively forming an organic protective layer 519 by photolithography so as to cover the periphery, and the first, second driving coils 517 and 518; and (k) removing the unnecessary oxide layer 502 by oxide layer etching to complete a chip 520 forming the main part of an electromagnetic actuator; and thereafter, (l) the chip 520 is placed and bonded on the chip support member 550 formed in the same manner as embodiment 3, a permanent magnet is diagonally mounted, and thus the electromagnetic actuator is completed.

As described above, provision of stoppers and weight reduction of movable plates provide prevention of damage of the torsion caused by the external shock.

Embodiment 6

Figure 20:
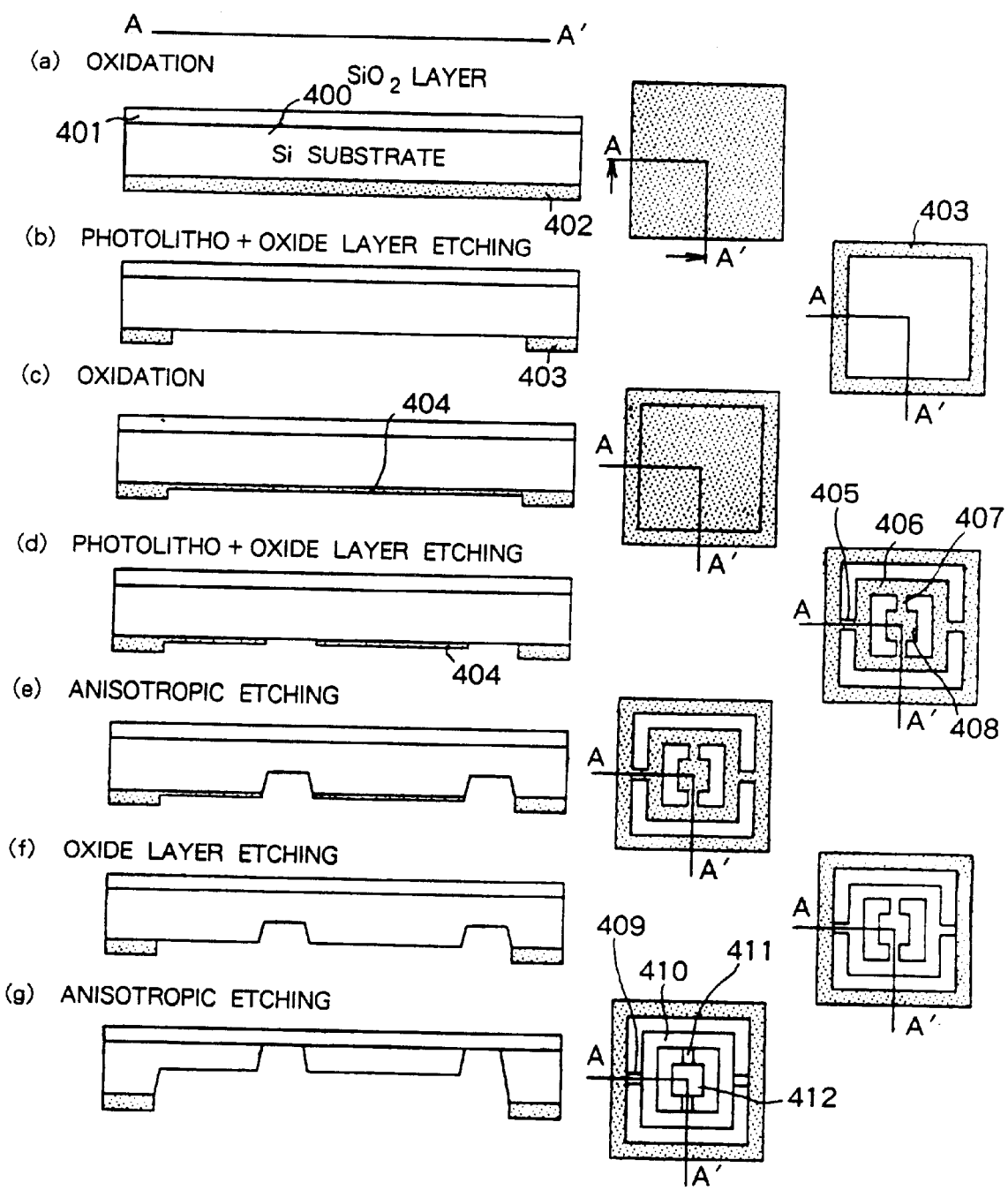
FIG. 20 is an illustrative view No.1 of the production process of an embodiment 6.
Figure 21:
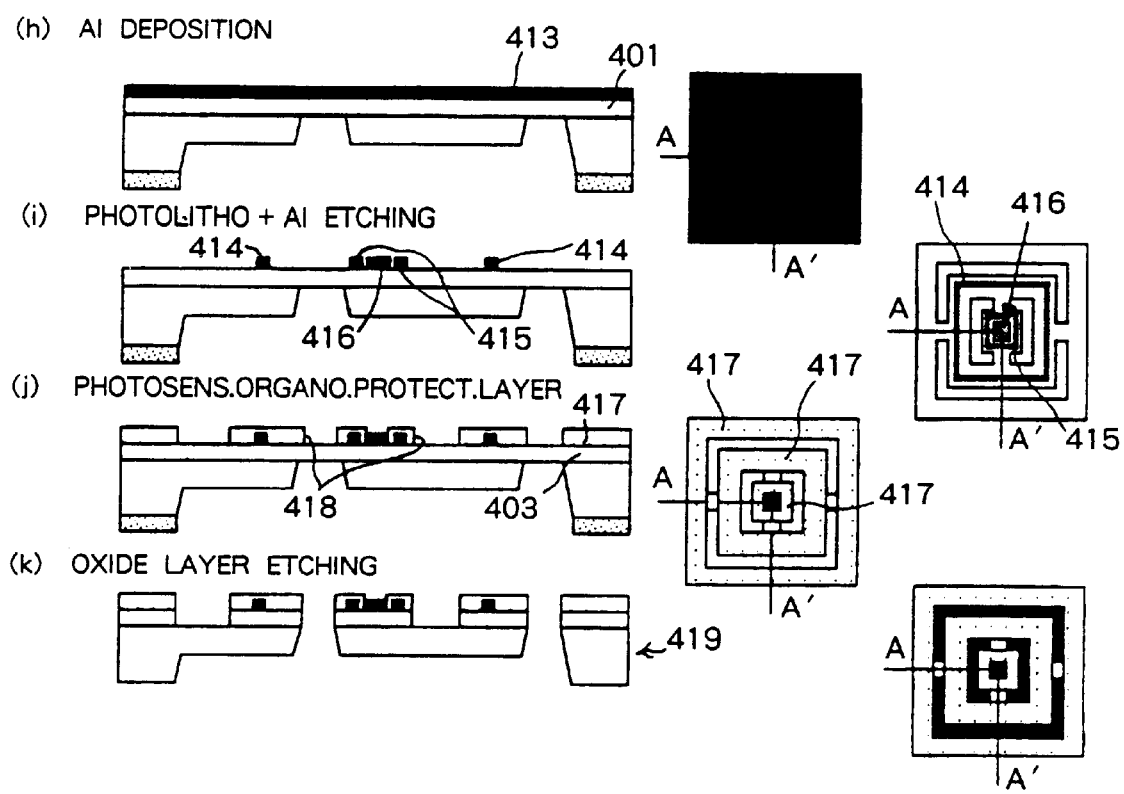
FIG. 21 is an illustrative view No.2 of the production process of embodiment 6.

The embodiment 6 shown in FIGS. 20, 21 and 22 is the process sequence improved with further highly utility in providing one or more stoppers and reducing the weight of movable plates:

In FIGS. 20, 21 and 22, the process sequence includes the step of:

(a) forming oxide layer 401, 402 on upper and lower faces of Si substrate 400 of 200 microns in thickness by oxidation;

(b) selectively removing the oxide layer 402 by photolithography and oxide layer etching, so as to leave the peripheral region 403;

(c) forming a thin oxide layer 404 by oxidation;

(d) selectively removing the oxide layer 402 by photolithography and oxide layer etching, so as to leave the regions including the first torsion bar 405, external movable plate 406, second torsion bar 407 and internal movable plate 408;

(e) further anisotropically etching the portion from which the oxide layer 407 has been removed in step (d);

(f) removing the still remaining oxide layer 404 by oxide layer etching; and (g) anisotropically etching the Si substrate 400 to form a first torsion bar 409, external movable plate 410, second torsion bar 411 and internal movable plate 412.

Further steps include:

(h) forming an aluminum layer 413 on oxide layer 401 by aluminum deposition;

(i) partially removing aluminum layer 409 by photolithography and aluminum etching to simultaneously form a first driving coil 414 on external movable plate periphery, a second driving coil 415 on internal movable plate periphery, and a mirror 416 as an optical element centered in the internal movable plate;

(j) selectively forming an organic protective layer 418 by photolithography over the first, second driving coils 414, 415 and the periphery 417; and (k) removing the still remaining portions 411 and 412 of oxide layer by oxide layer etching to complete a chip 419.

Further steps include:

(l) oxidizing the upper and lower faces of Si substrate 420 to form oxide layers 421 and 422;

(m) selectively removing the oxide layer 420 and 421 by photolithography and oxide layer etching, so as to leave the regions of stoppers 423 and 425 for the external movable plates and of the stopper 424 for the internal movable plate;

(n) bonding a Pyrex glass plate 426 on lower face of Si substrate 420 by anode bonding method;

(o) further anisotropically, selectively etching Si substrate, leaving the regions including stoppers 423, 424 and 425 to complete a chip support member 427; and (p) bonding the chip 419 and chip support member 427 also by anode bonding method. Thereafter, in the same manner as embodiment 3, permanent magnets are mounted diagonally relative to chip 419, and thus the electromagnetic actuator is completed.

With a simplified structure, the embodiment is practical and exhibits the same effect as embodiment 5.

Other than the two-dimensional motion, another type allows the optical axis of the optical element to oscillate one-dimensional, e.g., about one axis.

Instead of a mirror, a light-receiving or emitting element may be also employed as the optical element.

The stopper may be arranged, not limited on one side of the movable plate, on both sides thereof.

Embodiment 7

Figure 23:
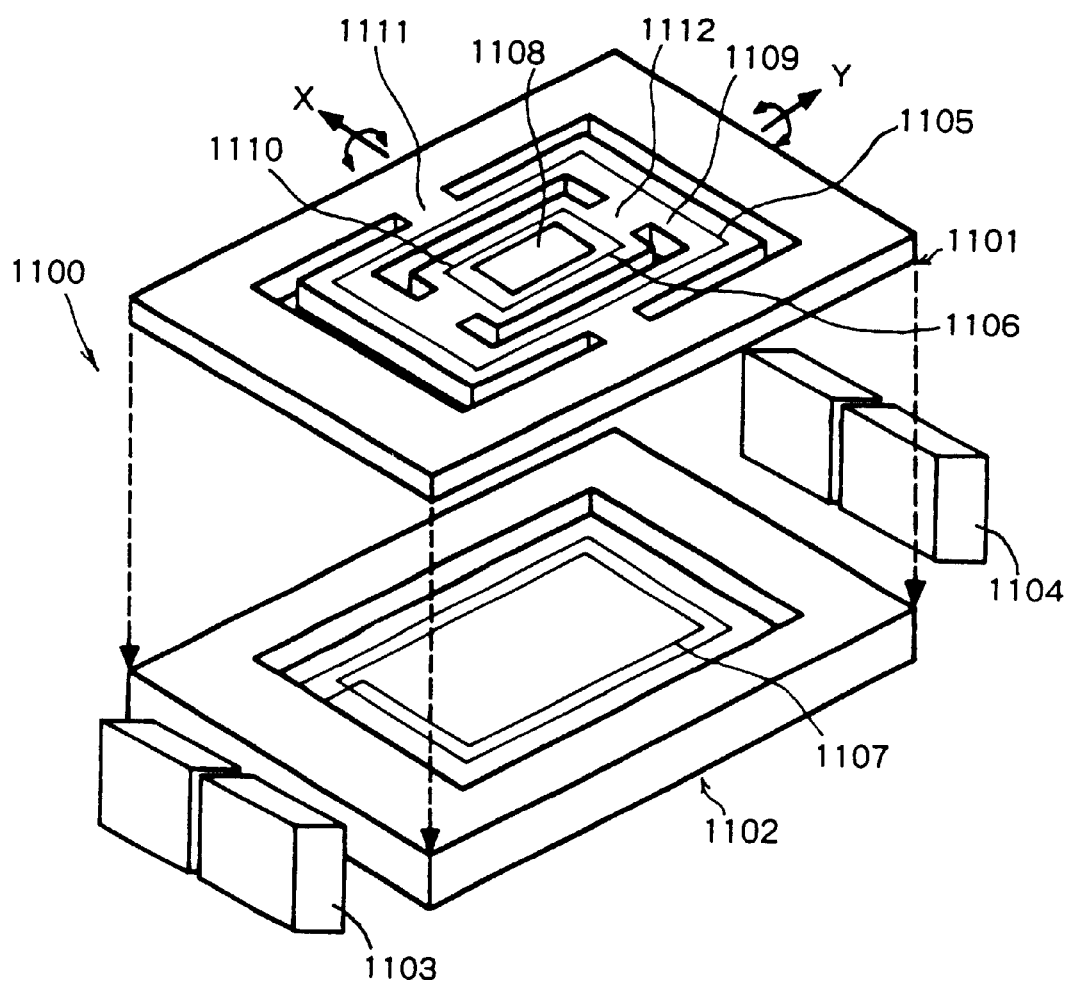
FIG. 23 is a perspective view of an embodiment 7.

In an actuator 1100 shown in FIG. 23 in summary, the optical axis of an optical element 1108 is allowed to oscillate in two-dimensional manner, a first and a second driving coils 1105 and 1106 each is formed as a closed circuit, and a primary coil 1107 is newly provided so as to couple with the first and second coils 1105 and 1106 above: a current is caused to flow, through the primary coil 1107, and indirectly in the first and second coils 1105 and 1106. Further included are respective external and internal movable plates 1109, 1110, and, first and second torsion bars 1111 and 1112, respectively.

The wiring patterns for torsion bars 1111 and 1112 are unnecessary and omitted, and also different from the Related art 2 in the arrangement of magnets 1103 and 1104, and the method of driving. But there is no difference in function in spite of the different arrangement of magnets 1103 and 1104, rather providing a simplified construction.

Figure 24:
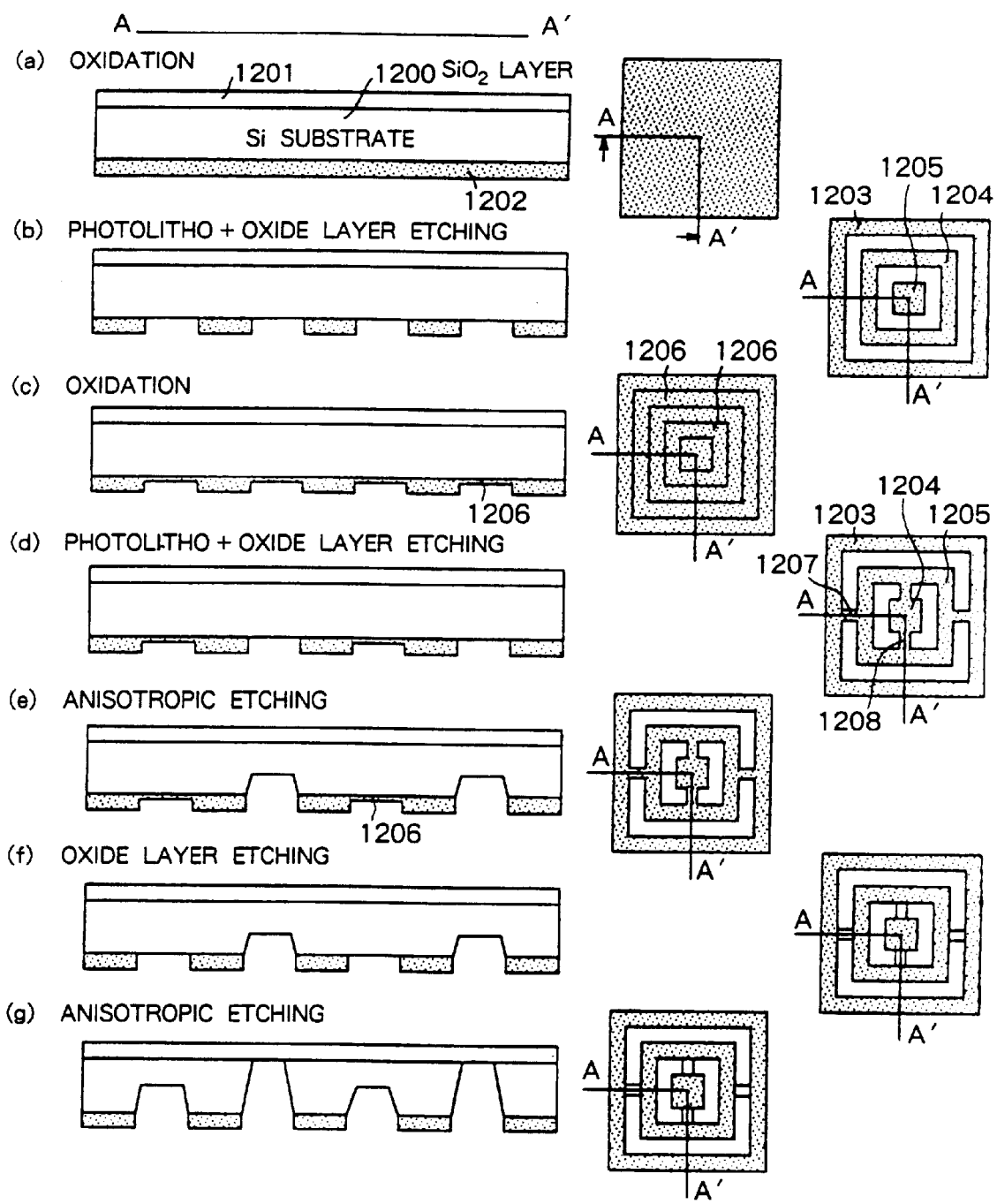
FIG. 24 is an illustrative view No.1 of the production process of a tip of the embodiment 7.
Figure 25:
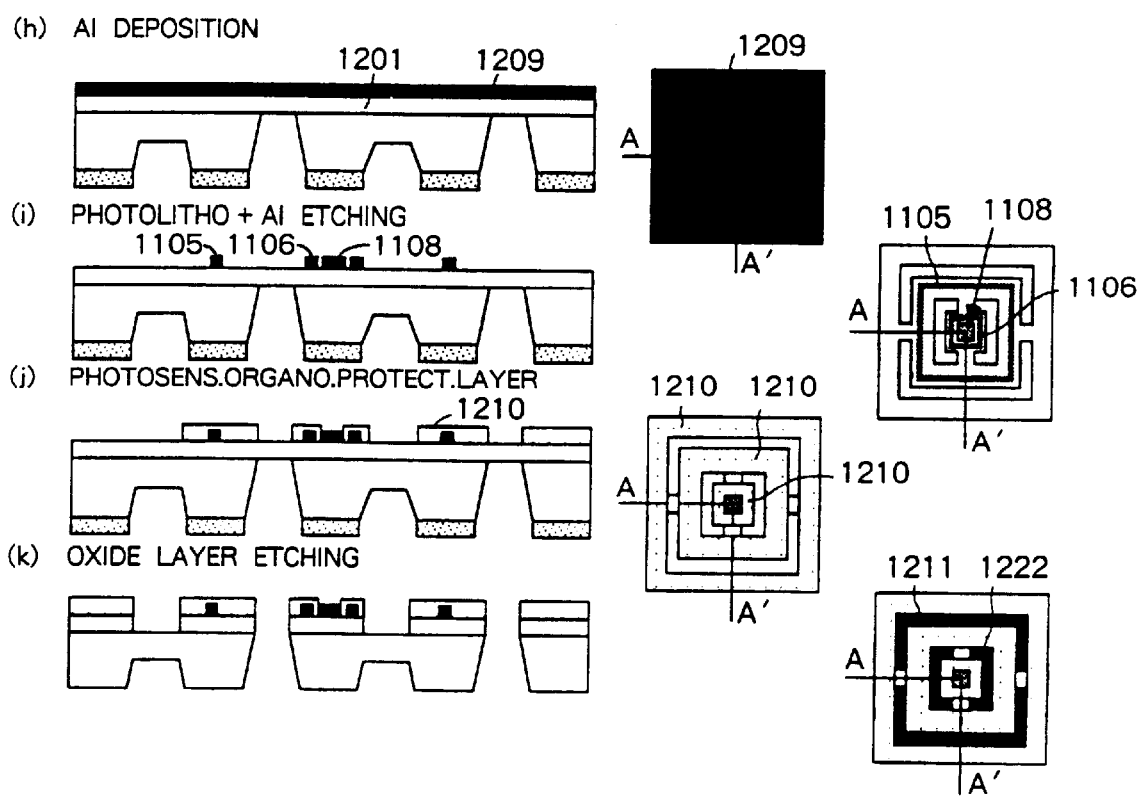
FIG. 25 is an illustrative view No.2 of the production process of embodiment 7.
Figure 26:
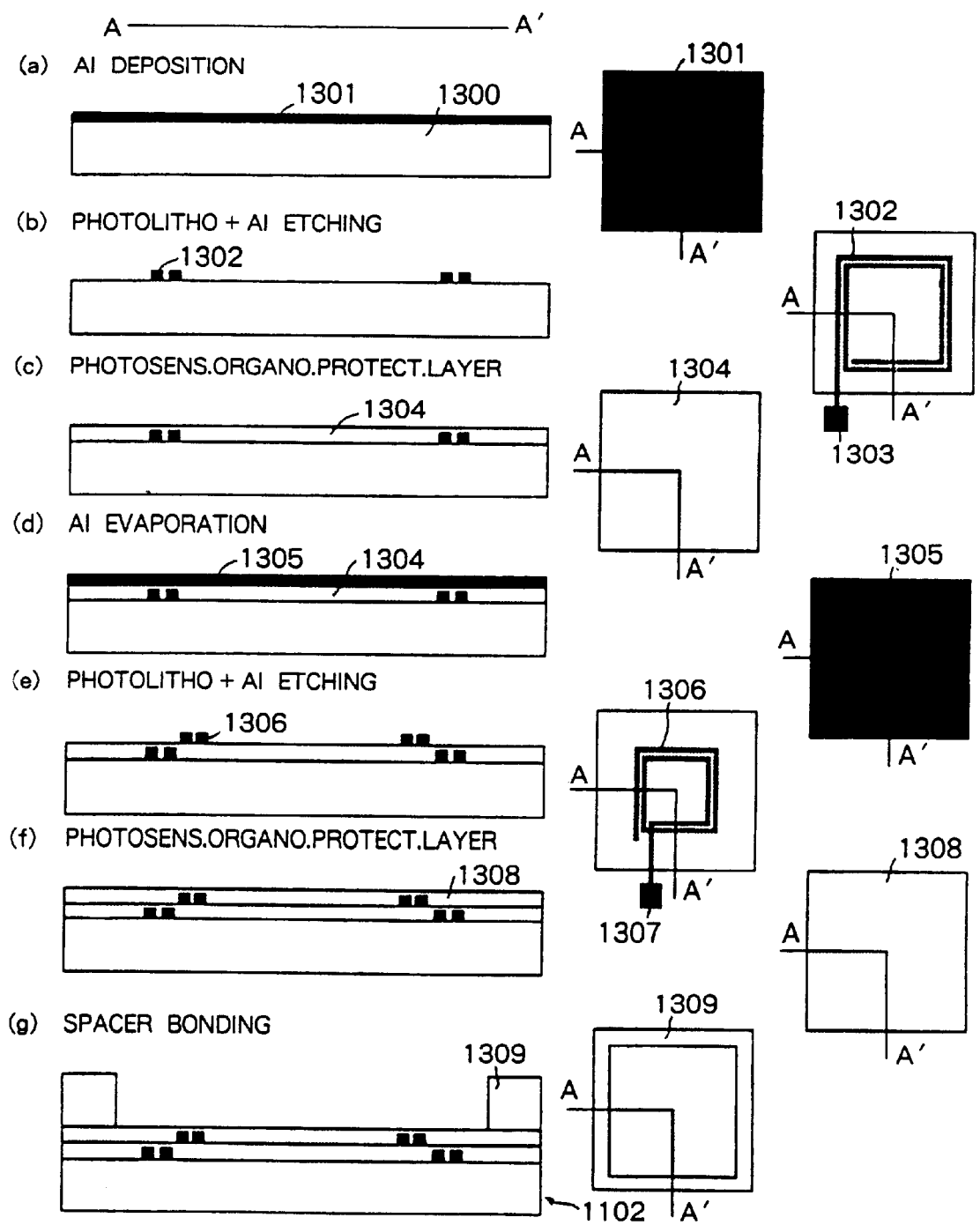
FIG. 26 is an illustrative view of the production process of a support substrate of the embodiment 7.

FIGS. 24 to 26 include plan views on the right side and sectional views taken along each of lines A—A on the left side.

In FIGS. 24, 25 and 26, the process sequence of the chip 1101 includes the steps of:

(a) forming oxide layer 1201, 1202 on upper and lower faces of Si substrate 1200 by oxidation;

(b) selectively removing the oxide layer 1202 by photolithography and oxide layer etching, so as to leave the regions including peripheral region 1203, external movable plate 1204 and internal movable plate 1205;

(c) oxidizing the region already removed in step (d) to form a thin oxide layer 1206;

(d) selectively removing the oxide layer 1202 by photolithography and oxide layer etching, so as to leave the regions including the first torsion bar 1207, external movable plate 1204, second torsion bar 1208 and internal movable plate 1205;

(e) anisotropically etching the portion from which the oxide layer has been removed in step (d);

(f) removing the still remaining oxide layer 1206 by oxide layer etching; and (g) further anisotropically etching from the lower face of silicon substrate 1200.

Referring now to FIG. 25, further steps include:

(h) forming aluminum layer 1209 on oxide layer 1201 by aluminum deposition;

(i) partially removing aluminum layer 1209 by photolithography and aluminum etching to simultaneously form a single-turn closed looped first driving coil 1105, an also single-turn closed looped second driving coil 1106, and a mirror 1108 as an optical element;

(j) selectively forming an organic protective layer 1210 by photolithography so as to surround the periphery 1203, and the first, second driving coils 1105, 1106; and (k) removing the unnecessary portions 1211 and 1212 of oxide layer 1201 by oxide layer etching to complete a chip 1100.

FIG. 26 shows the process sequence of support assembly 1102 including the steps of:

(a) forming aluminum layer 1301 on a Pyrex glass base 1300 by aluminum deposition;

(b) selectively removing aluminum layer 1301 by photolithography and aluminum etching to form the first turn 1302 of primary coil 1107 and one terminal 1303 therefor;

(c) forming an insulating layer 1304 entirely on the upper face of the base;

(d) forming an aluminum deposited layer 1305 over insulating layer 1304;

(e) selectively removing aluminum layer 1305 by photolithography and aluminum etching to form the second turn 1306 of primary coil 1107 and the other terminal 1307 therefor;

(f) forming an organic protective layer 1308 on the upper face entirely; and (g) bonding a spacer 1309 around the periphery to complete the support assembly 1102.

ASSEMBLY: FIG. 27 shows the sequence of assembly comprising the steps of:

(a) bonding the chip 1101 shown in step (k) of FIG. 25 on the support member 1102 in step (g) of FIG. 26; and (b) mounting the magnets 1103, 1104 on the opposite sides relative to chip 1101 to complete the actuator 1100. The S-pole of magnet 1103 and the N-pole of magnet 1104 are connected through a yoke, which serves also as a package, but not shown.

ACTUATION: The manner of actuating the actuator is described referring to FIG. 28 wherein both the external and internal movable plates 1109 and 1110 (FIG. 23) are allowed to oscillate in the resonant state, and assume the resonant frequencies for external and internal plates are 375 and 1500 Hz, respectively.

Figure 28:
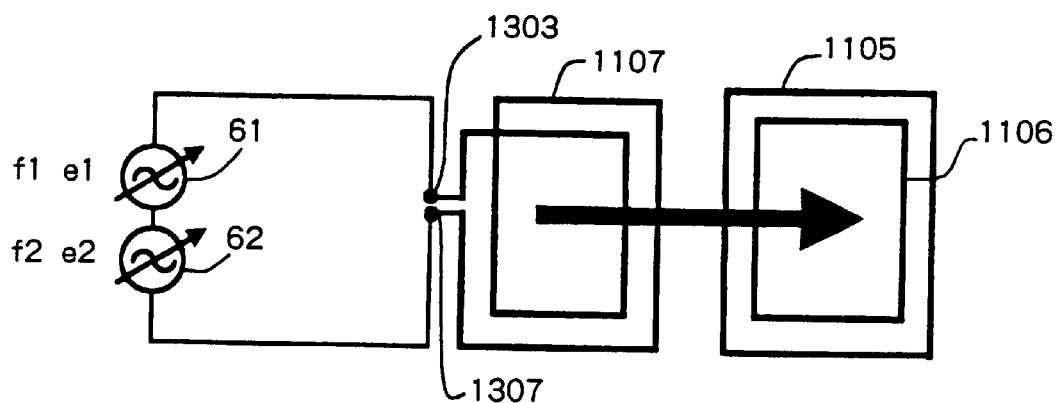
FIG. 28(a) is a schematic view describing the driving process of the embodiment 7.
FIG. 28(b) is a diagram useful in explaining the operation of the circuit device of FIG. 28(a)
Figure 28:
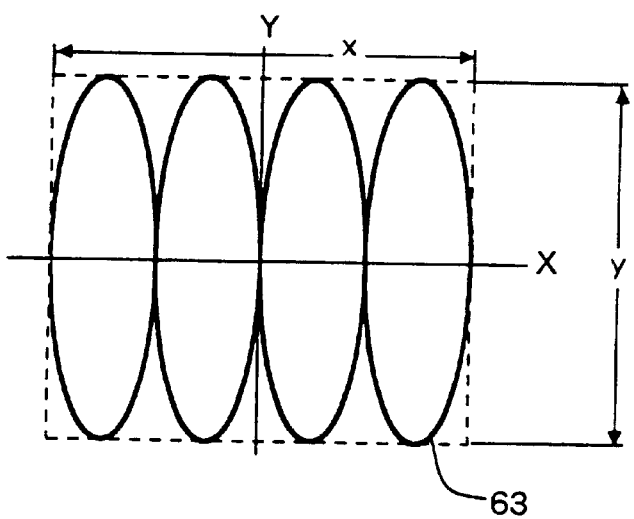
Figure 29:
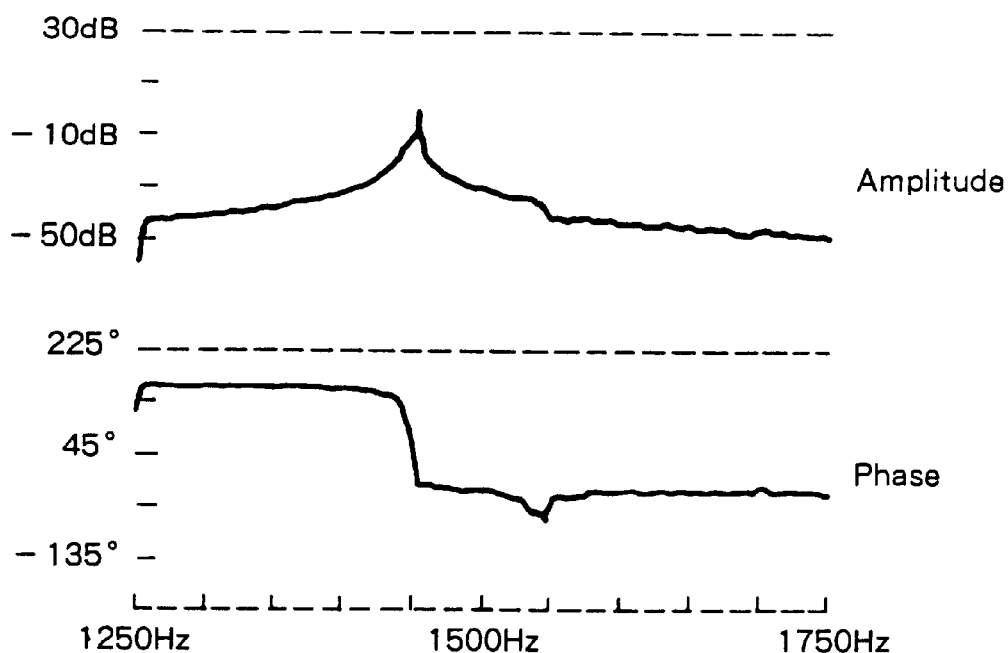
FIGS. 29(a) and 29(b) are diagrammatic views illustrating the resonance property.
Figure 29:
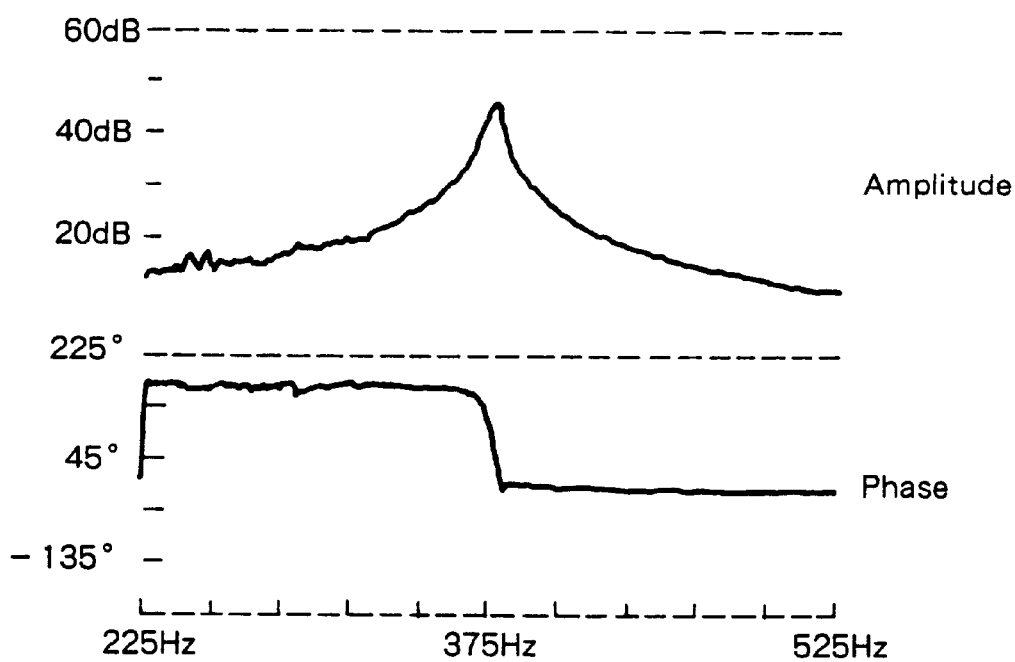

As shown in FIG. 28(*a*), first, a first sine wave a.c. source 61 and a second sine wave a.c. source 62 are connected in series, and connected to the primary coil 1107 in order to actuate the device. Then, through the first and second driving coils 1105 and 1107, which are electromagnetically coupled to primary coil 1106, each of the currents of 375 and 1500 Hz flows in each of the coils 1105 and 1106, respectively. As a result, the external and internal movable plates are actuated in resonant state of 375 and 1500 Hz, respectively, and the optical axis of optical element 1108 is allowed to oscillate as one of Lissajous FIG. 63 as shown by FIG. 28(*b*).

The amplitude $\chi$ in the x-direction can be varied by variation of voltage e of the a.c. source 61, and, similarly, the amplitude $\gamma$ in the y-direction by variation of voltage $e_2$ of the a.c. source 62. When the ratio of resonant frequencies between the external and internal movable plates 1109 and 1110 is selected so as not to coincide with any integer, the Lissajous figure moves and a fine scanning becomes possible.

Instead of actuating using a power source having a small internal impedance, also a source having a larger internal impedance may be used, by connecting both sources in parallel to terminals 1303 and 1307. In addition, as the resonant characteristic of an electromagnetic actuator of the type is extremely steep (i.e. having a high mechanical Q), the external movable plate 1109 would not be actuated by the current of 1500 Hz, and the internal movable plate 1100 would not be actuated by the current of 375 Hz.

As discussed above, according to the invention, no provision of wiring patterns on the torsion bars enables a long life, and the simplified production process provides the improved yield and low cost in production.

Embodiment 8

Figure 30:
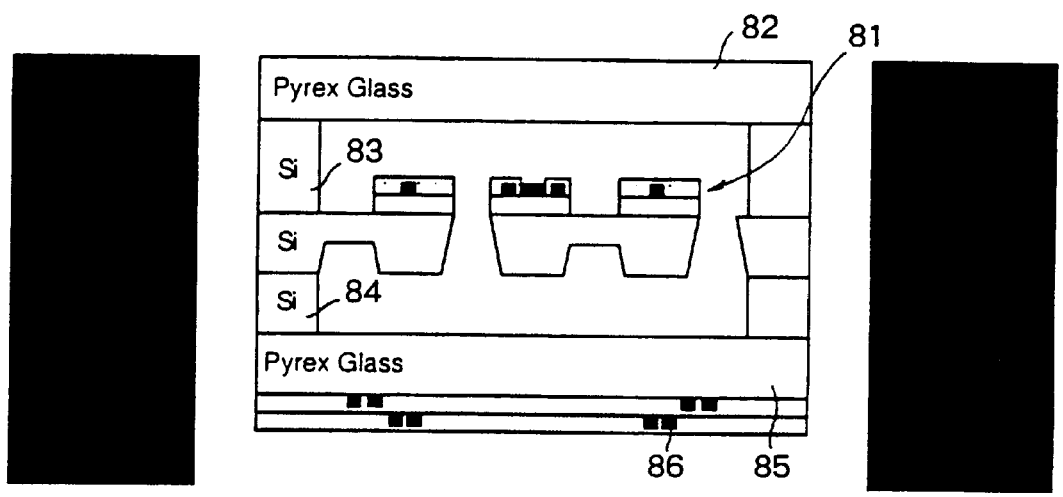
FIG. 30 is a schematic view of embodiment 8.

FIG. 30 shows an electromagnetic actuator, in which a chip 81 as described above is vacuum sealed by a Pyrex glass base 82 and 85 and silicon spacers 83 and 84, by which seal the response characteristics is improved and time degradation is prevented.

The primary coil 86 is formed out of sealed region or on the external area of the electromagnetic actuator. 83 84 81

Bonding of Si spacers 83, 84 with chip 81 is performed by anode bonding with forming a Pyrex glass layer by sputtering on the side of spacer. Bonding of Pyrex glass 82 with Si spacer 83, 84, and also bonding of Pyrex glass 85 with Si spacers 84, are also by anode bonding. This anode bonding includes: close aligning each smooth surfaces of Si and glass bases, heating up to 400° C., and applying a negative voltage of several hundred volts on the side of the glass to achieve bonding.

The embodiment is actuated in the same manner as the foregoing embodiment 7.

Although formed of vacuum sealed type, there is no leadout wiring out of the primary and secondary driving coils, and, therefore, the seal reliability is sufficiently high. The same effect can be attained by a gas seal which is of the type for sealing against an inactive gas, instead of vacuum seal.

Embodiment 9

Figure 31:
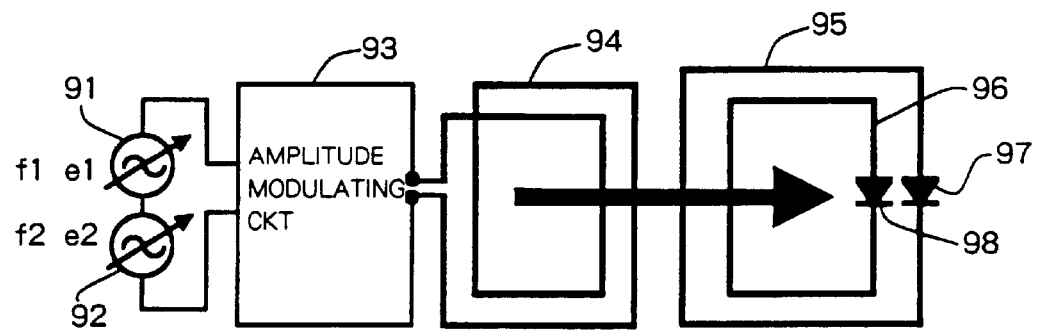
FIG. 31(a) is a schematic view describing the driving process of an embodiment 9.
FIG. 31(b) is a diagram useful for explaining the operation of the cirucit device of FIG. 31(a).
Figure 31:
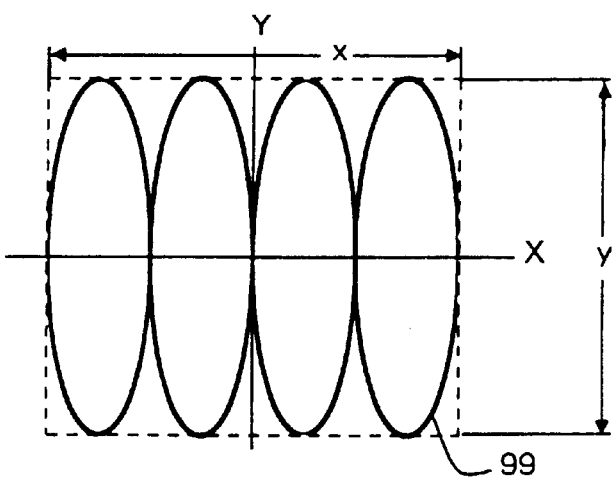
Figure 32:
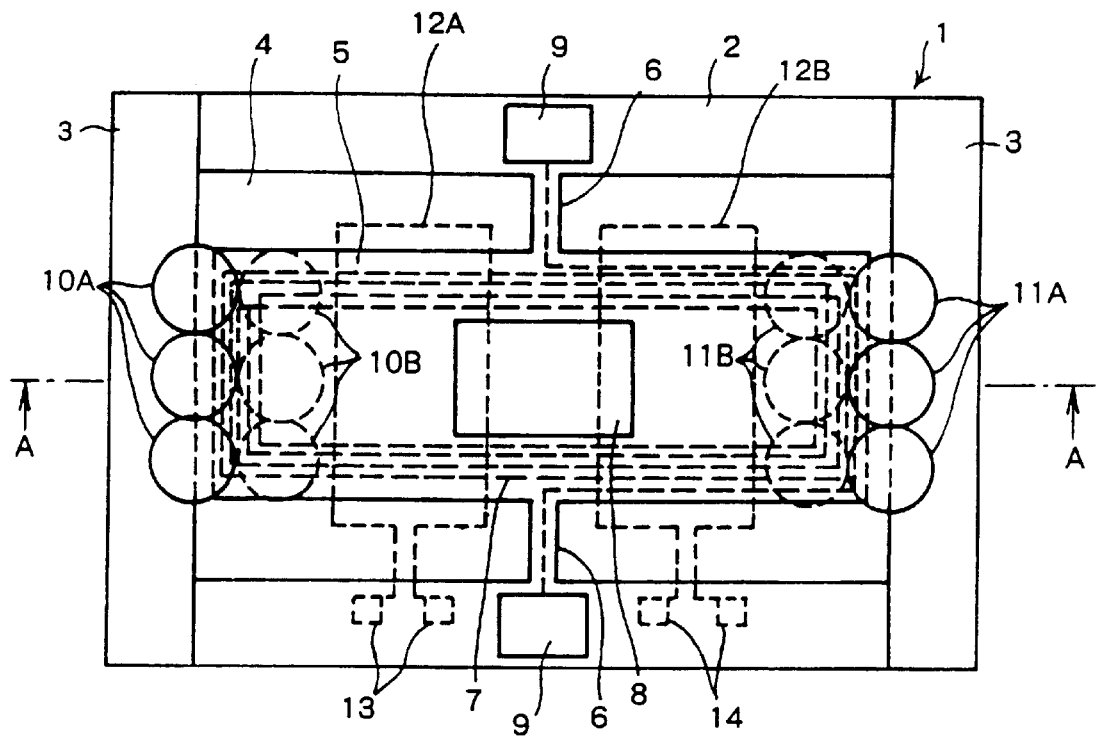
FIG. 32 is a plan view of the device of Related Art 1.
Figure 33:
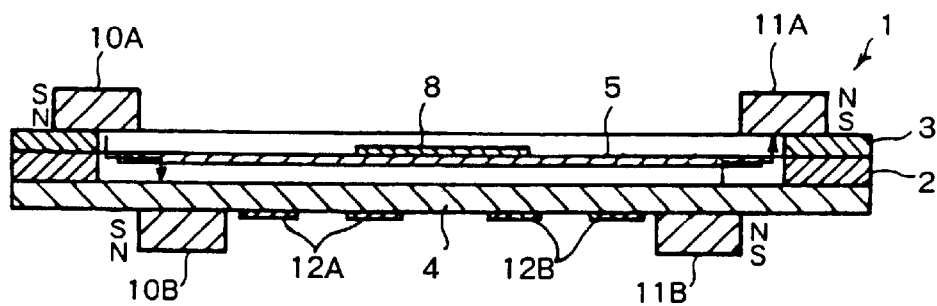
FIG. 33 is a sectional view of FIG. 32.
Figure 34:
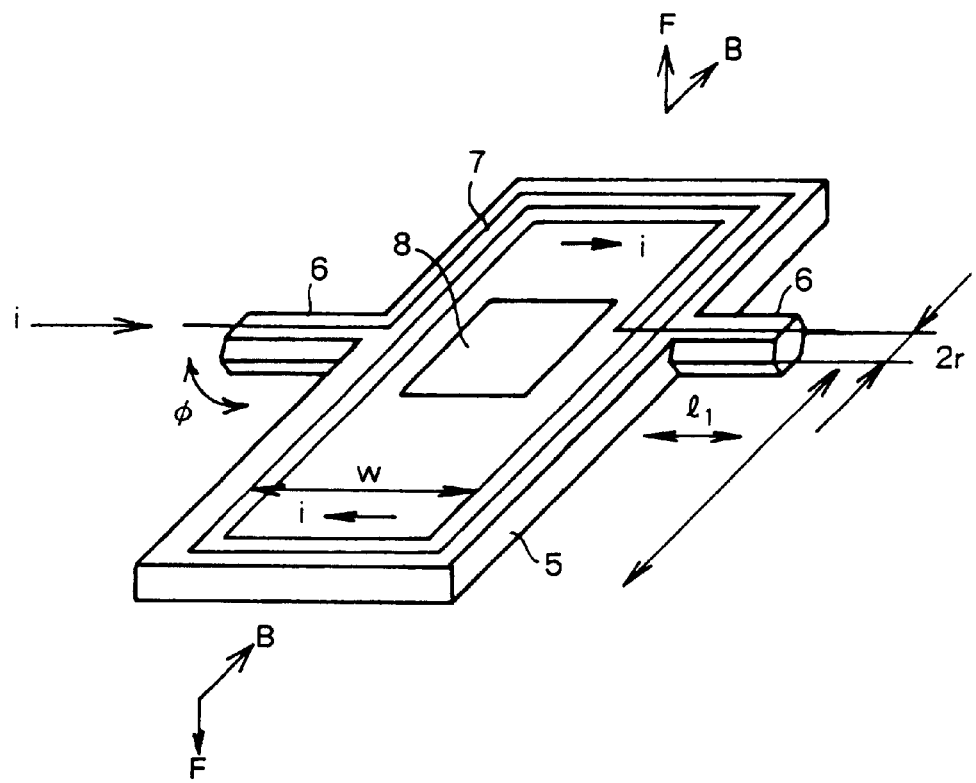
FIG. 34 is a perspective view of the device of the Related Art 1.
Figure 35:
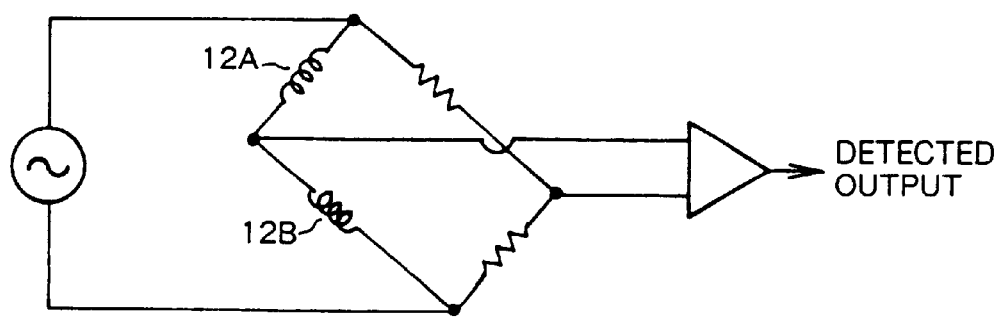
FIG. 35 is a principle diagram for angle detection in the Related Art 1.
Figure 36:
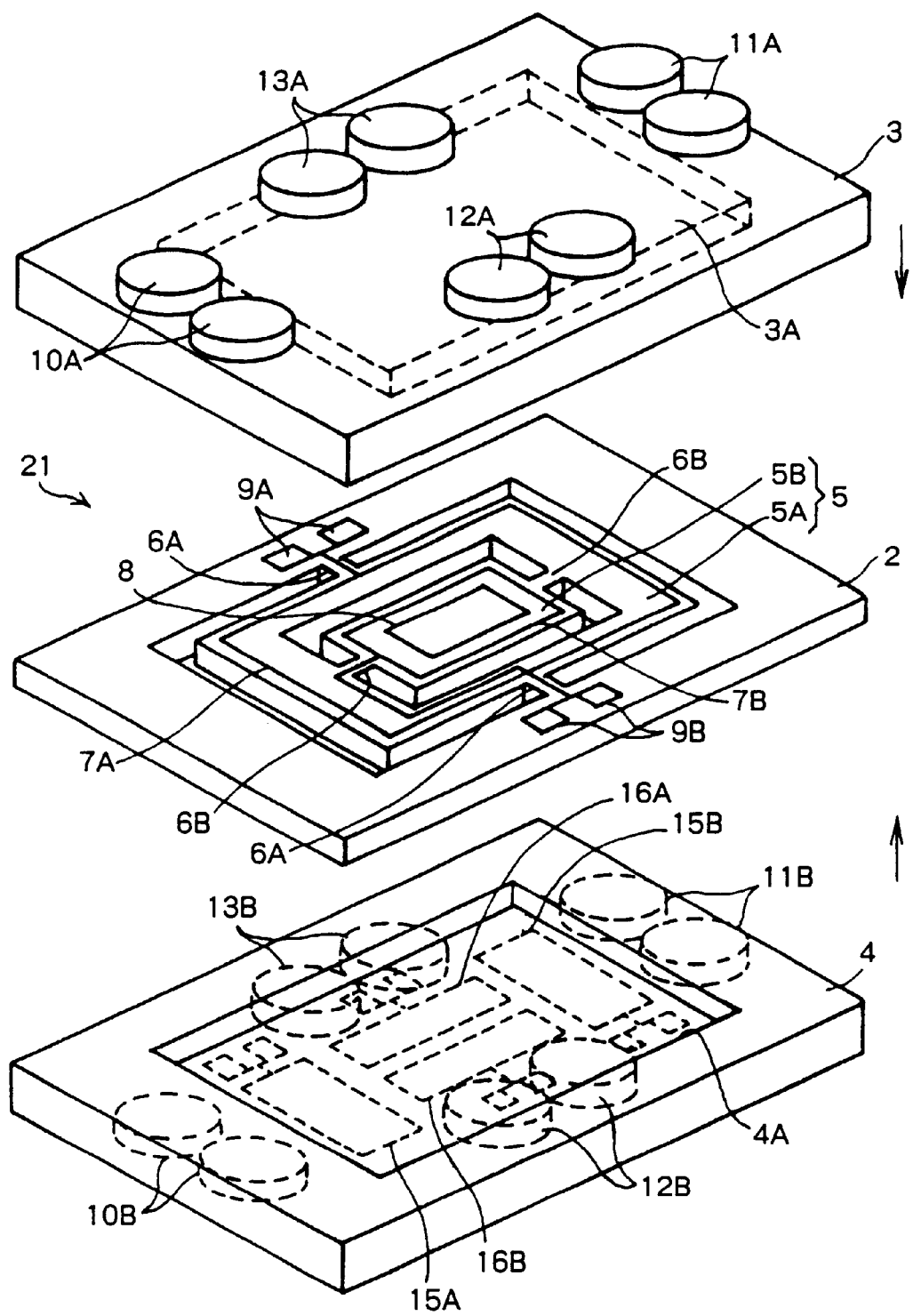
FIG. 36 is a perspective exploded view of the Related Art 2.
Figure 37:
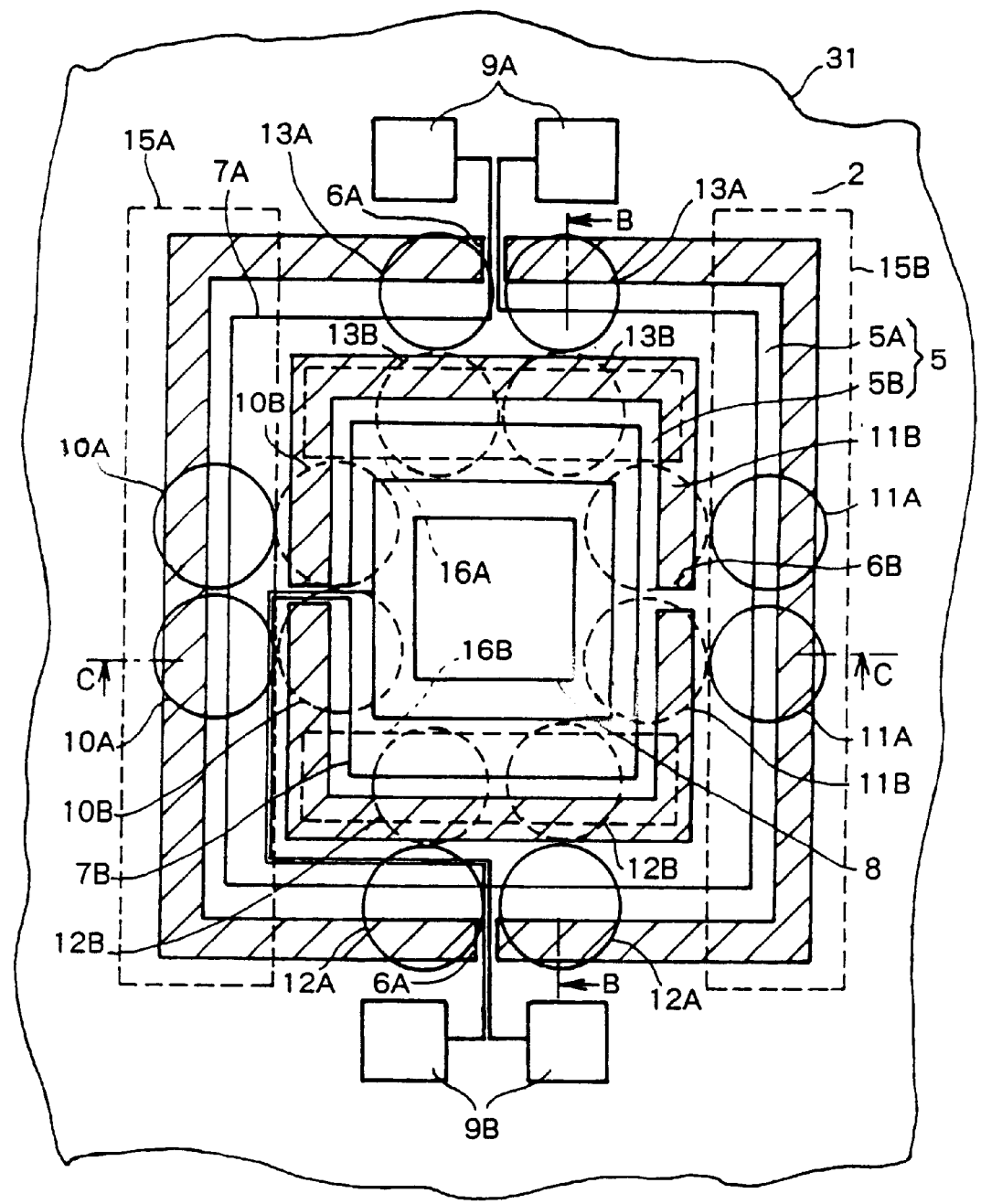
FIG. 37 is a plan view of the Related Art 3.
Figure 38:
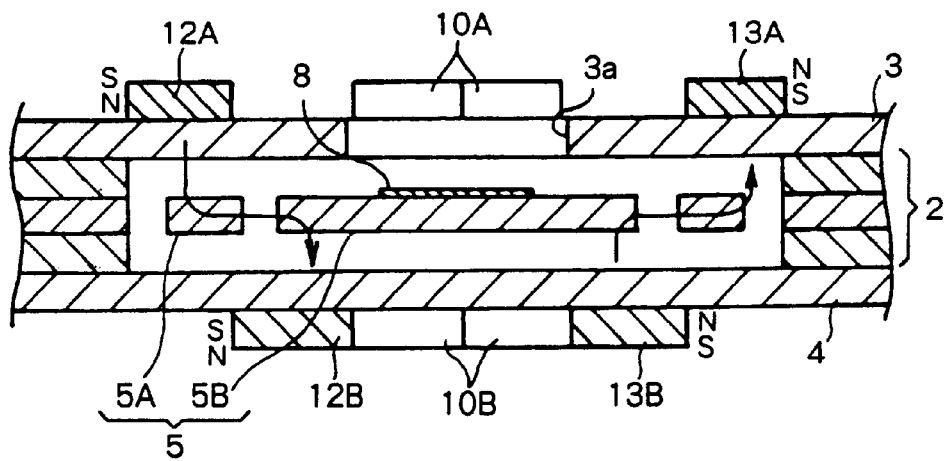
FIG. 38 is a sectional view taken along B—B of FIG. 37.
Figure 39:
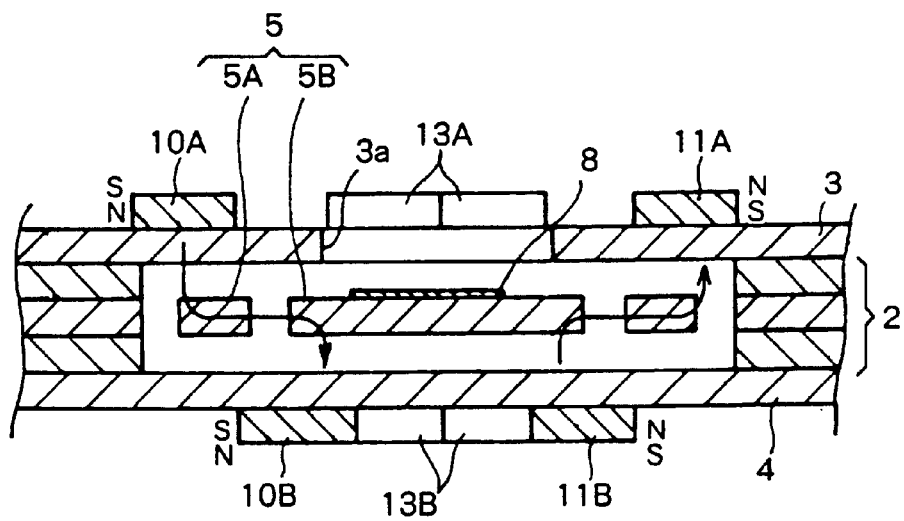
FIG. 39 is a sectional view taken along C—C of FIG. 37.

FIG. 31(*a*) shows the principal construction of the embodiment 9 and method of actuation therefor, in which a carrier frequency is used for actuation from the primary coil to the first driving coil or to the second driving coil.

In either of embodiments 7 and 8, the primary coil, first driving coil and the second driving coil together form a coreless transformer. Therefore, as leakage flux is increased, the actuating frequency is low and energy transfer efficiency is also low.

The matter of leakage flux can be solved to a some extent by decreasing the distance between the primary coil and first and second driving coils as small as possible. The matter of biasing frequency is, in the case of the embodiment 9, solved by utilizing a carrier of several hundred KHz.

As shown in FIG. 31(*a*), the first driving coil 95 forms a closed circuit through a diode 97, and the second driving coil 96 forms also a closed circuit through a diode 98. As a result, each of these closed circuits forms a mean value type diode detection circuit. Diodes 97 and 98 are formed by a known semiconductor technology on the external and internal movable plates, respectively. Hereinafter it is discussed, when the resonant frequency of the external movable plate is assumed to 375 Hz, while that of the internal movable plate 1500 Hz, and carrier frequency 400 KHz.

A sine wave a.c. source 91 of 375 Hz and another sine wave a.c. source 92 of 1500 Hz are connected in series to provide a composite wave, applied to an amplitude modulation circuit 93, and a separately generated carrier of 400 KHz is modulated.

Using thus formed amplitude modulated frequency, the primary coil 94 is actuated. As a result, based on the electromagnetic coupling with the primary coil 94, a modulated frequency is in induced in each of the first and second driving coils, each being demodulated by each of diodes.

Currents of 375 Hz, 1500 Hz as well as the d.c. component each flow in both the first and second coils. Therefore, the first driving coil 95 is actuated in resonant state by the current of 365 Hz, while the second driving coil 96 is actuated in resonant state by the current of 1500 Hz.

As a result, the optical axis of the optical element such as a mirror is caused to oscillate so as to trace a Lissajous figure 99 in FIG. 31(b).

The amplitude $\chi$ in the x-direction can be varied by variation of voltage e of the a.c. source 91, and, similarly, the amplitude $\gamma$ in the y-direction by variation of voltage $e_2$. Since the external and internal movable plates are actuated into the resonant state, the extent of being driven by the current of d.c. component is merely negligibly few.

The energy transfer efficiency between the first and second coils can be increased. In addition, when the ratio of resonant frequencies between the internal and external sides is selected so as not to be any integer, a scan of even a rectilinear figure is realized.

The invention can be applied also for an electromagnetic actuator having only one movable plate, other than having two or more plates as previously discussed.

Alternatively, another feature is possible, so that the first driving coil is supplied with a current via terminals, while only the second driving coil is actuated by means of inductive coupling by the primary coil. In such a case, the current induced in the first coil due to actuation by the primary coil can be blocked by in series connecting, as necessary, a choke coil between the first coil and its power source, where the external movable plate is permitted to be driven in a state other than the resonance, e.g. by a sine waveform or sawtooth waveform of an arbitrary frequency.

Also, not limited as having a single turn, any one of driving coils may be of a plurality of turns.

As to materials, not limited as formed of aluminum, any of others, such as copper or gold layer, may be employed.

Accordingly, the invention provides an electromagnetic actuator with a low cost, a stabilized life, and improved strength against physical shocks.

At least part of the wiring for torsion bars can be also saved, and this is to in turn contribute the long life of use.

Industrial Utility

The invention is widely applicable for optical scanners or sensors for a variety of information equipment, such as bar code scanners, CD-ROM drives, or sensors for automatic booking machines.

What is claimed is:

1. An electromagnetic actuator comprising:
   an external movable plate formed integrally with a semiconductor substrate;
   a first torsion bar for movably supporting said movable plate with respect to said semiconductor substrate;
   an internal movable plate disposed inside said external movable plate;
   a second torsion bar rotatably supporting said internal movable plate relative to said external movable plate, and positioned at a right angle relative to said first torsion bar; further including:
      a single turn first driving coil extending around said external movable plate;
      a single turn second driving coil extending around said internal movable plate, and connected in series to said first driving coil;
      magnetic field generating means for applying a magnetic field to said first and second driving coils; and
      an optical element having an optical axis and located on said internal movable plate;
      wherein a current is caused to flow through said first and second driving coils to produce a force corresponding to each coil and to each plate, said external and internal movable plates displacing in response to the corresponding coil forces applied thereto and thus vary the direction of displacement of said optical axis.

2. The electromagnetic actuator of claim 1 wherein the single turn first and second driving coils are closed-looped.

3. A method of manufacturing the electromagnetic actuator according to any one of claims 1 or 2 comprising:
   forming an aluminum layer on the semiconductor substrate by aluminum deposition; and
   forming said driving coils from said aluminum layer through photolithography and aluminum etching.

4. A method of manufacturing the electromagnetic actuator of claim 3 comprising forming said optical element as a mirror at the same time as the forming of said driving coils from said aluminum layer through photolithography and aluminum etching.

5. A method of manufacturing the electromagnetic actuator of claim 3 comprising forming wiring on said torsion bar for coupling said driving coils at the same time as the forming of said driving coils from said aluminum layer through photolithography and aluminum etching.

6. The electromagnetic actuator of claim 1 wherein said external and internal movable plates are each formed as a thin film from said semiconductor substrate, said thin film being thinner than said semiconductor substrate and substantially no thicker than said torsion bar.

7. An electromagnetic actuator comprising:
   a pair of movable plates formed integrally with a semiconductor substrate;
   at least one torsion bar for movably supporting said movable plates with respect to said semiconductor substrate;
   a driving coil extending around each said movable plates;
   magnetic field generating means for applying a magnetic field to each of the driving coils;
   an optical element formed on one of said movable plates and having an optical axis; and
   a primary coil electromagnetically connected to each of said driving coils;
   wherein a current caused to flow through said primary coil and in each said driving coil creates a force corresponding to each driving coil and to each plate, each said movable plates displacing in response to the applied corresponding force to thereby vary the direction of displacement of said optical axis.

8. The electromagnetic actuator of claim 7 wherein:
   one of the pair of plates is an external movable plate and the other of the pair of plates is an internal movable plate disposed inside said external movable plate;
   the torsion bar comprises a first torsion bar for movably supporting said external movable plate with respect to said semiconductor substrate and a second torsion bar movably supporting said internal movable plate relative to said external movable plate, and positioned at a right angle relative to said first torsion bar;
   the driving coils comprising a first driving coil formed as a closed-loop extending around said external movable plate and a second driving coil formed as a closed-loop around said internal movable plate;
   the magnetic field generating means for applying a magnetic field to said first and second driving coils;
   the optical element being formed on said internal movable plate.

9. The electromagnetic actuator of claim 7 wherein the driving coil about each plate forms a closed loop and includes a diode; and further includes means for flowing a modulation current in said primary coil so that a demodulation current flows through said driving coil in response to said modulation current in said primary coil to create said force associated with each driving coil and associated with each plate to vary the direction of the displacement of said optical axis.

10. The electromagnetic actuator of claim 9 wherein:

the movable plates include an external movable plate and an internal movable plate disposed inside said external movable plate;

the torsion bar comprises a first torsion bar for movably supporting said external movable plate with respect to said semiconductor substrate and a second torsion bar movably supporting said internal movable plate relative to said external movable plate, and positioned at a right angle relative to said first torsion bar;

the optical element being formed on said internal movable plate.

11. The electromagnetic actuator of any one of claims 8 to 10 wherein the area including the movable plates, torsion bar and second driving coil is arranged in a vacuum or gas encapsulated region and said first driving coil is disposed outside said region.

12. The electromagnetic actuator of claim 8 wherein the primary coil and driving coils are arranged so that current flows in said first and second coils in response to a current in said primary coil.

13. The electromagnetic actuator of claim 8 including means for applying a current to the first driving coil, the primary coil for applying a modulated current to said second driving coil, the second driving coil including means such that a demodulated current flows in said second driving coil, said currents for creating said corresponding force.

14. A method of manufacturing the electromagnetic actuator of any one of claims 7 to 10 and 12–13 comprising depositing an aluminum layer on said semiconductor substrate by vacuum evaporation, and forming said driving coils from said aluminum layer through photolithography and aluminum etching.

15. The method of manufacturing the electromagnetic actuator of claim 14 comprising depositing an aluminum layer on said semiconductor substrate by vacuum evaporation, and forming the optical element and driving coils simultaneously from said aluminum layer by said photolithography and etching, the optical element comprising a mirror.

* * * * *